(12) United States Patent
Ishida et al.

(10) Patent No.: US 9,214,354 B2
(45) Date of Patent: Dec. 15, 2015

(54) MANUFACTURING METHOD FOR SEMICONDUCTOR DEVICE

(71) Applicant: Synaptics Display Devices GK, Tokyo (JP)

(72) Inventors: Hiroshi Ishida, Tokyo (JP); Kazuhiko Sato, Tokyo (JP)

(73) Assignee: Synaptics Display Devices GK, Tokyo (JP)

( * ) Notice: Subject to any disclaimer, the term of this patent is extended or adjusted under 35 U.S.C. 154(b) by 0 days.

(21) Appl. No.: 14/572,512

(22) Filed: Dec. 16, 2014

(65) Prior Publication Data
US 2015/0171103 A1    Jun. 18, 2015

(30) Foreign Application Priority Data

Dec. 17, 2013    (JP) .................................. 2013-259911

(51) Int. Cl.
| | |
|---|---|
| *H01L 21/8242* | (2006.01) |
| *H01L 21/306* | (2006.01) |
| *H01L 27/115* | (2006.01) |
| *H01L 21/762* | (2006.01) |
| *H01L 21/28* | (2006.01) |
| *H01L 29/66* | (2006.01) |
| *H01L 21/8234* | (2006.01) |
| *H01L 29/49* | (2006.01) |
| *H01L 21/265* | (2006.01) |

(52) U.S. Cl.
CPC .... *H01L 21/30625* (2013.01); *H01L 21/28282* (2013.01); *H01L 21/76224* (2013.01); *H01L 21/823462* (2013.01); *H01L 27/11573* (2013.01); *H01L 29/66537* (2013.01); *H01L 21/26586* (2013.01); *H01L 29/4916* (2013.01)

(58) Field of Classification Search
USPC ......................................................... 438/241
See application file for complete search history.

(56) References Cited

U.S. PATENT DOCUMENTS

| | | | | |
|---|---|---|---|---|
| 8,076,192 | B2* | 12/2011 | Taniguchi | H01L 21/823462 257/E21.689 |
| 8,304,820 | B2* | 11/2012 | Yamakoshi | H01L 27/11546 257/288 |
| 8,305,802 | B2* | 11/2012 | Kawashima | H01L 21/28282 365/174 |
| 2014/0353740 | A1* | 12/2014 | Nishida | H01L 21/823814 257/326 |
| 2015/0054045 | A1* | 2/2015 | Chakihara | H01L 21/28273 257/314 |

FOREIGN PATENT DOCUMENTS

JP        2012216857 A    11/2012

* cited by examiner

*Primary Examiner* — Asok K Sarkar
(74) *Attorney, Agent, or Firm* — Patterson & Sheridan, LLP

(57) ABSTRACT

In a manufacturing method of sequentially forming a gate electrode film of the MOSFET, forming a gate electrode film of the non-volatile memory FET, patterning the gate electrode of the non-volatile memory FET, and patterning the gate electrode of the MOSFET, in order to form the MOSFET and the non-volatile memory FET on the same semiconductor substrate. The value of the product of S/L and H/L is specified in a case that the line of the gate electrode of the non-volatile memory FET is set to L, the space thereof is set to S, and the height thereof is set to H so that the thickness of a resist film on the gate electrode of the non-volatile memory FET which is formed in advance is set to a thickness which is not lost by etching for forming the gate electrode of the MOSFET.

8 Claims, 26 Drawing Sheets

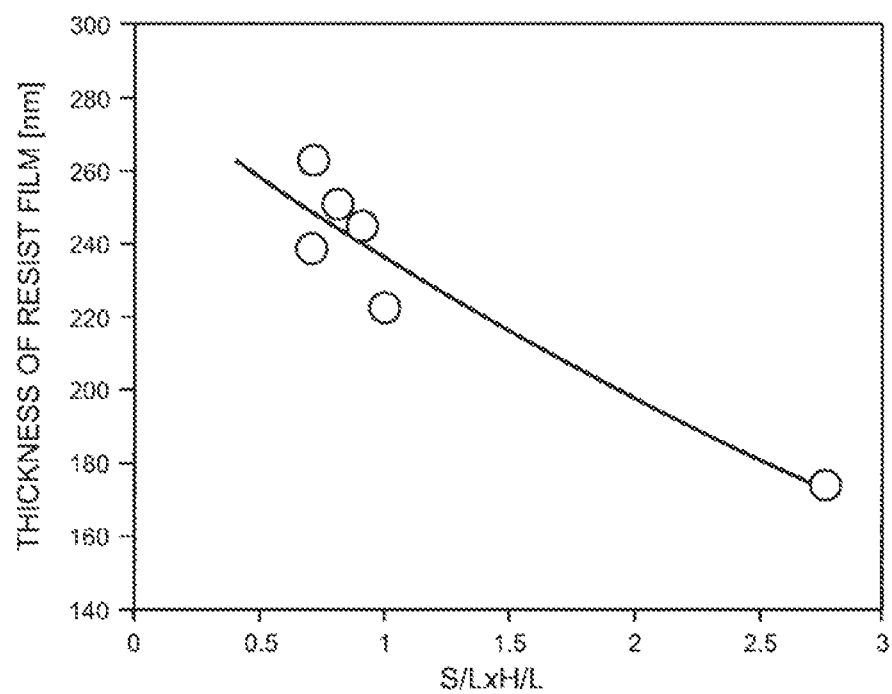

MANUFACTURING METHOD FOR SEMICONDUCTOR DEVICE

CROSS-REFERENCE TO RELATED APPLICATIONS

The present application claims priority from Japanese patent application JP 2013-259911 filed on Dec. 17, 2013, the content of which is hereby incorporated by reference into this application.

BACKGROUND

The present invention relates to a manufacturing method for fabricating a semiconductor device, and particularly relates to a technique which is capable of being suitably used for a semiconductor device in which a non-volatile memory and a normal MISFET (Metal Insulator Semiconductor Field Effect Transistor) are combined.

Semiconductor integrated circuits (for example, LSI: Large Scale Integrated circuit) having a non-volatile memory combined with a logic circuit, a memory circuit, an analog circuit or the like, have been in widespread use. MOSFETs (Metal Oxide Semiconductor Field Effect Transistors) including a silicon oxide ($SiO_2$) film in a gate insulating film, among MOSFETs, are frequently used in the logic circuit or the like. On the other hand, FETs (Field Effect Transistors) including a charge storage film in the gate insulating film may be used in the non-volatile memory. The charge storage film has a trap level, and carriers are trapped (stored) in the trap level. Thereby, information is stored using a phenomenon in which the threshold voltage of the FET changes. The carriers trapped in the trap level are held even in a case that the supply of power to a circuit is stopped, and thus function as the non-volatile memory. As the charge storage film, a silicon nitride ($Si_3N_4$) film is frequently used, and is formed of a three-layer structure interposed in a potential barrier film between a gate electrode and a channel. As the potential barrier film, a silicon oxide ($SiO_2$) film is frequently used, and the film of the three-layer structure is called an ONO (Oxide/Nitride/Oxide) film. Such an FET is called a MONOS (Metal/Oxide/Nitride/Oxide/Semiconductor) type FET from its structure. In a manufacturing method for an LSI circuit having the non-volatile memory, a gate insulating film of a normal FET and an ONO film are required to be formed on the same semiconductor substrate, and thus various techniques have been proposed.

In one example, JP-A-2012-216857 discloses a technique for forming a MOSFET and a MONOS type FET on the same semiconductor substrate. In first and second embodiments, a manufacturing method is disclosed in which an ONO film and a polysilicon film for forming a gate electrode of a MONOS type FET are first formed on the entire surface of the semiconductor substrate, a region having the MOSFET formed therein is opened, and then a gate oxide film and a polysilicon film of the MOSFET are formed. In third and fourth embodiments, a manufacturing method is disclosed in which the gate oxide film and the polysilicon film of the MOSFET are reversely first formed on the entire surface of the semiconductor substrate, and then the ONO film and the polysilicon film for forming the gate electrode of the MONOS type FET are formed.

SUMMARY

Methods for manufacturing a semiconductor device including a non-volatile memory FET and a MOSFET are provided. In one embodiment a manufacturing method for a semiconductor device including a non-volatile memory FET and a MOSFET includes (e) forming a first gate electrode film on the entire surface of a semiconductor substrate; (i) opening a region having the non-volatile memory FET formed therein and exposing a semiconductor surface of the semiconductor substrate, after the step (e); (m) forming a charge storage three-layer film by sequentially depositing a first potential barrier film, a charge storage film, and a second potential barrier film, after the step (i); (n) forming a second gate electrode film on the charge storage three-layer film, after the step (m); (o) patterning a gate electrode of the non-volatile memory FET after the step (n); (p) forming a resist film in a region of the non-volatile memory FET and a region having a gate electrode of the MOSFET formed therein, using lithography, after the step (o); and (q) etching the first gate electrode film which is not covered with the resist film formed in the step (p), after the step (p), wherein a value of a product of S/L and H/L is specified in a case that a line of the gate electrode of the non-volatile memory FET is set to L, a space thereof is set to S, and a height thereof is set to H so that in the step (p), a thickness of the resist film on the gate electrode of the non-volatile memory FET is set to a thickness which is not lost by the etching step of the step (q).

In another embodiment, a manufacturing method for a semiconductor device having a non-volatile memory FET and a MOSFET formed on a single semiconductor substrate includes forming a gate electrode film of the MOSFET in a portion of a surface of the semiconductor substrate; patterning and forming a gate electrode of the non-volatile memory FET in another portion of the surface of the semiconductor substrate; forming a resist film for patterning the gate electrode of the MOSFET; and etching the gate electrode film corresponding to a portion which is not covered with the resist film, wherein a value of a product of S/L and H/L is specified in a case that a line of the gate electrode of the non-volatile memory FET is set to L, a space thereof is set to S, and a height thereof is set to H so that thickness of the resist film on the gate electrode of the non-volatile memory FET is set to a thickness which is not lost by the etching.

BRIEF DESCRIPTION OF THE DRAWINGS

FIG. 30 is a graph illustrating experimental results regarding a relationship between the value of space/line×height/line (S/L×H/L) of the gate electrode of the MONOS type FET 54 and the thickness of the resist film on the gate electrode.

DETAILED DESCRIPTION

Introduction

As a result of examination of JP-A-2012-216857 by the inventor, it can be understood that there is the following new problem.

Figure 22:
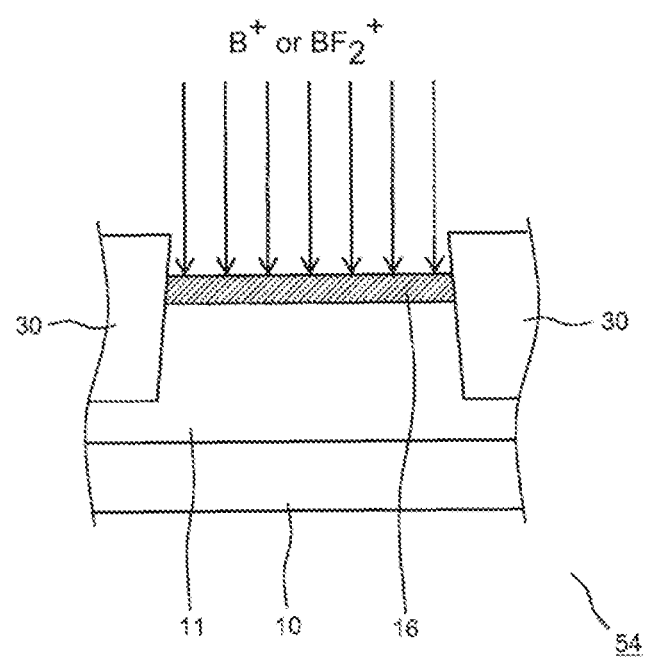
FIG. 22 is a schematic cross-sectional view (cross-section X-X of FIG. 21) illustrating the semiconductor device 1 in order to explain a channel ion implantation step of the MONOS type FET 54.
Figure 23:
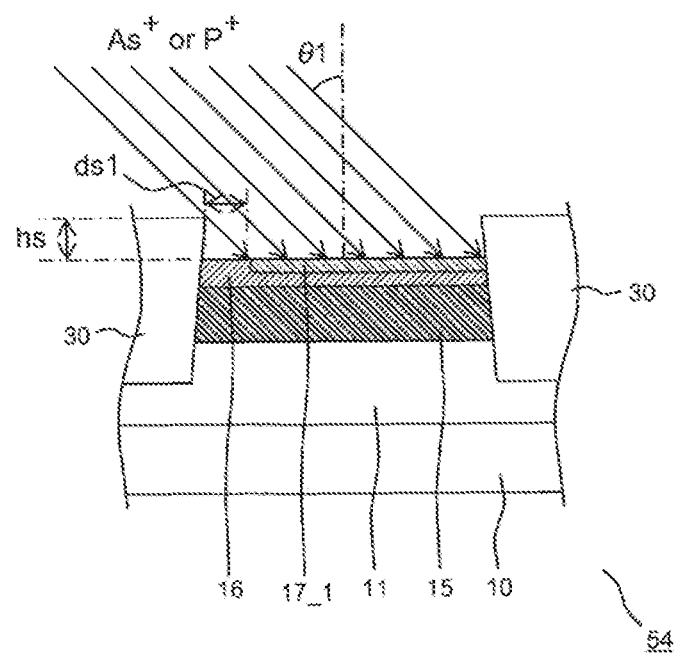
FIG. 23 is a schematic cross-sectional view (cross-section X-X of FIG. 21) illustrating the semiconductor device 1 in order to explain an oblique ion implantation step of a channel region of the MONOS type FET 54 from one side.
Figure 24:
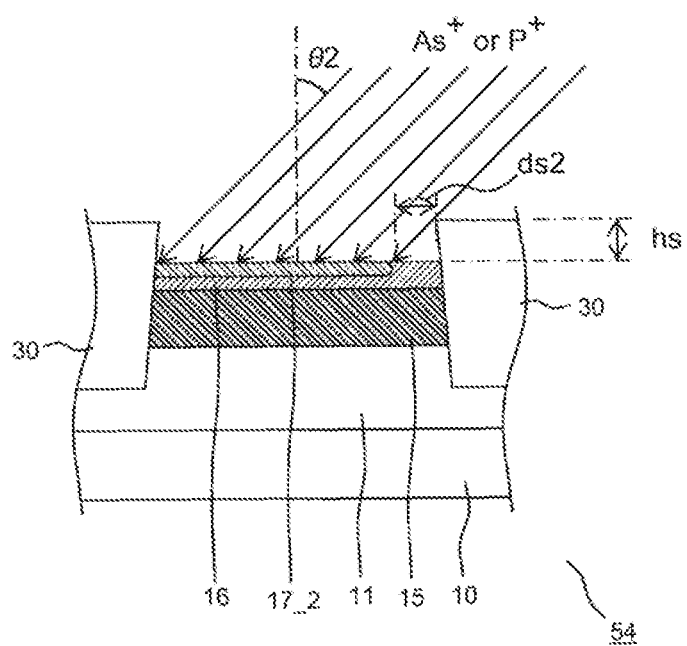
FIG. 24 is a schematic cross-sectional view (cross-section X-X of FIG. 21) illustrating the semiconductor device 1 in order to explain an oblique ion implantation step of the channel region of the MONOS type FET 54 from the other side.
Figure 25:
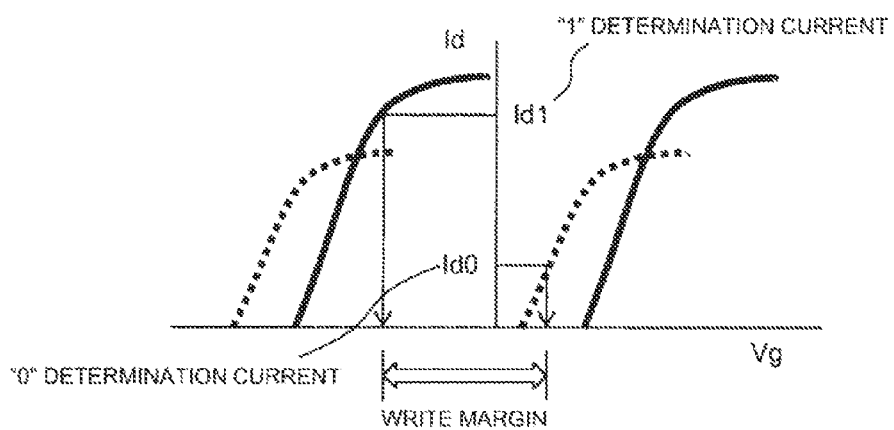
FIG. 25 is a diagram illustrating the electrical characteristics of the MONOS type FET 54 having kink characteristics.

In a manufacturing method described in third and fourth embodiments of JP-A-2012-216857, as shown in FIG. 22 of the above document, a cap insulating film 32 is formed on the polysilicon film for forming the gate electrode of the MONOS type FET, and then the gate electrode of the MONOS type FET is patterned (FIG. 23), and a gate electrode of the MOSFET is further patterned (FIG. 24 in the third embodiment, and FIG. 25 in the fourth embodiment). Although not described in the above document, a lithography process is performed in which the entire surface of the semiconductor substrate in the state of FIG. 23 is covered with a resist, and a region of the MONOS type FET and a region having the gate electrode of the MOSFET formed therein are left behind and opened. In this case, the resist is applied with a substantially uniform film thickness. However, since the gate electrode is previously patterned in the region of the MONOS type FET, the film thickness of the resist on the gate electrode becomes smaller than other regions in order to bury the irregularities thereof. For this reason, in an etching step of removing a polysilicon film in which the gate electrode of the MOSFET is formed except for a gate electrode portion, since the resist film is also simultaneously etched, there is a concern that the resist film formed thinner than other regions on the gate electrode of the MONOS type FET from the beginning may disappear, the gate electrode of the MONOS type FET may be exposed, and etching damage may be suffered.

One advantage of the invention is to suppress etching damage to a gate electrode of a non-volatile memory FET (MONOS type FET) in an etching step of patterning a gate electrode of a MOSFET, in a manufacturing method of sequentially forming a gate electrode film of the MOSFET, forming a gate electrode film of the non-volatile memory FET, patterning the gate electrode of the non-volatile memory FET, and patterning the gate electrode of the MOSFET, in order to form the MOSFET and the non-volatile memory FET on the same semiconductor substrate.

Means for solving such a problem will be described below, but other problems and novel features will be apparent from the following description and accompanying drawings of the specification.

According to an embodiment, a manufacturing method for a semiconductor device including a non-volatile memory FET and a MOSFET may be configured as follows. A gate electrode film of the MOSFET is formed, a region having the non-volatile memory FET formed therein is opened, a gate electrode of the non-volatile memory FET is patterned, and then a gate electrode of the MOSFET is patterned. In this case, the value of the product of S/L and H/L is specified in a case that the line of the gate electrode of the non-volatile memory FET is set to L, the space thereof is set to S, and the height thereof is set to H so that the thickness of a resist film on the gate electrode of the non-volatile memory FET which is formed in advance is set to a thickness which is not lost by etching when forming the gate electrode of the MOSFET.

A brief description of an effect obtained by the embodiment is as follows.

That is, it is possible to suppress etching damage to a gate electrode of a non-volatile memory FET (MONOS type FET) in an etching step of patterning a gate electrode of a MOSFET, in a manufacturing method of sequentially forming a gate electrode film of the MOSFET, forming a gate electrode film of the non-volatile memory FET, patterning the gate electrode of the non-volatile memory FET, and patterning the gate electrode of the MOSFET, in order to form the MOSFET and the non-volatile memory FET on the same semiconductor substrate.

1. Summary of the Embodiments

First, summary of representative embodiments of the invention disclosed in the application will be described. Reference numerals in drawings in parentheses referred to in description of the summary of the representative embodiments just denote components included in the concept of the components to which the reference numerals are designated.

Example 1

Prevention of Etching Damage to Gate Electrode of Non-Volatile Memory FET

A manufacturing method for a semiconductor device (1) including a non-volatile memory FET (54) and a MOSFET (51 to 53) includes the following steps:
(e) a step of forming a first gate electrode film (31) on the entire surface of a semiconductor substrate (10);
(i) a step of opening a region (44) having the non-volatile memory FET formed therein and exposing a semiconductor surface of the semiconductor substrate, after the step (e);
(m) a step of forming a charge storage three-layer film (20) by sequentially depositing a first potential barrier film (21), a charge storage film (22), and a second potential barrier film (23), after the step (i);
(n) a step of forming a third gate electrode film (33) on the charge storage three-layer film, after the step (m);
(o) a step of patterning a gate electrode (64) of the non-volatile memory FET after the step (n);
(p) a step of forming a resist film (94) in a region of the non-volatile memory FET and a region having a gate electrode (61 to 63) of the MOSFET formed therein, using lithography, after the step (o); and
(q) a step of etching the first gate electrode film which is not covered with the resist film formed in the step (p), after the step (p), and a value of a product of S/L and H/L is specified in a case that a line of the gate electrode (64) of the non-volatile memory FET is set to L, a space thereof is set to S, and a height thereof is set to H so that in the step (p), a thickness of the resist film on the gate electrode of the non-volatile memory FET is set to a thickness which is not lost by the etching step of the step (q).

Thereby, it is possible to suppress etching damage to the gate electrode (64) of the non-volatile memory FET (MONOS type FET, 54) in the etching step of patterning the gate electrode (61 to 63) of the MOSFET (51 to 53). The mechanism thereof will be described in detail in a fifth embodiment stated later.

Example 2

Two-Layer Polysilicon Structure

In the manufacturing method for a semiconductor device according to Example 1, the first gate electrode film is a first polysilicon film, the method further including the following steps:
(f1) a step of forming a CMP stopper film (29) on the first gate electrode film after the step (e);
(f2) a step of forming an element isolation groove in each element isolation region (30) that isolates a plurality of the non-volatile memory FETs and a plurality of the MOSFETs from each other, after the step (f1);
(f3) a step of burying the element isolation groove after the step (f2), and further forming an insulating film on the entire surface of the semiconductor substrate;
(f4) a step of polishing the surface of the semiconductor substrate until the CMP stopper film is exposed, through chemical mechanical polishing (CMP), after the step (f3);
(f5) a step of selectively removing the CMP stopper film after the step (f4); and
(g) a step of forming a second polysilicon film (32) on the entire surface of the semiconductor substrate, after the step (f5), and
the step (q) is a step of etching the first polysilicon which is the first gate electrode film and the second polysilicon which are not covered with the resist film formed in the step (p).

Thereby, even in a case that a gate electrode is adopted which has a so-called two-layer polysilicon structure in which the polysilicon film (32) located above the first gate electrode film is further formed after the formation of the STI, it is possible to suppress etching damage to the gate electrode (64) of the non-volatile memory FET (MONOS type FET, 54).

Example 3

Gate Electrode Film of Non-Volatile Memory FET is Thinner than Two-Layer Polysilicon Structure In the manufacturing method for a semiconductor device according to Example 2, a thickness of the third gate electrode film (33) is smaller than that of a gate electrode film of the MOSFET in which the first polysilicon film and the second polysilicon film are laminated.

Therefore, it is possible to suppress etching damage to the gate electrode (64) of the non-volatile memory FET (MONOS type FET, 54).

Example 4

ONO Film

In the manufacturing method for a semiconductor device according to any one of the Examples 1 to 3 described above, the first potential barrier film and the second potential barrier film are silicon oxide films, and the charge storage film is a silicon nitride film or a silicon oxynitride film.

Thereby, the charge storage three-layer film (20) can be formed of an ONO film.

Example 5

Prevention of Etching Damage to Gate Electrode of Non-Volatile Memory FET

A manufacturing method for a semiconductor device (1) having a non-volatile memory FET (54) and a MOSFET (51 to 53) formed on a single semiconductor substrate (10), includes:

a step of forming a gate electrode film (31, 32) of the MOSFET in a portion of a surface of the semiconductor substrate, a step of patterning and forming a gate electrode (64) of the non-volatile memory FET in another portion of the surface of the semiconductor substrate, a step of then forming a resist film (94) for patterning the gate electrode (61 to 63) of the MOSFET, and a step of etching the gate electrode film corresponding to a portion which is not covered with the resist film, and a value of a product of S/L and H/L is specified in a case that a line of the gate electrode of the non-volatile memory FET is set to L, a space thereof is set to S, and a height thereof is set to H so that thickness of the resist film on the gate electrode of the non-volatile memory FET is set to a thickness which is not lost by the etching.

Thereby, it is possible to suppress etching damage to the gate electrode (64) of the non-volatile memory FET (MONOS type FET, 54) in the etching step of patterning the gate electrode (61 to 63) of the MOSFET (51 to 53), similarly to Example 1 described above.

Example 6

Two-Layer Polysilicon Structure

In the manufacturing method for a semiconductor device according to Example 5, the gate electrode film of the MOSFET is formed by a first polysilicon film formed before formation of an element isolation layer (3) and a second polysilicon film formed after formation of the element isolation layer (3) being laminated.

Thereby, even in a case that a gate electrode is adopted which has a so-called two-layer polysilicon structure, it is possible to suppress etching damage to the gate electrode (64) of the non-volatile memory FET (MONOS type FET, 54).

Example 7

Gate Electrode Film of Non-Volatile Memory FET is Thinner than Two-Layer Polysilicon Structure In the manufacturing method for a semiconductor device according to Example 6, a thickness of a third gate electrode film (33) is smaller than that of the gate electrode film of the MOSFET in which the first polysilicon film and the second polysilicon film are laminated.

Thereby, it is possible to suppress etching damage to the gate electrode (64) of the non-volatile memory FET (MONOS type FET, 54).

Example 8

ONO Film

In the manufacturing method for a semiconductor device according to any one of Examples 5 to 7, the first potential barrier film and the second potential barrier film are silicon oxide films, and the charge storage film is a silicon nitride film or a silicon oxynitride film.

Thereby, the charge storage three-layer film (20) can be formed of an ONO film.

2. Further Detailed Description of the Embodiments

A further detailed description of the embodiments will be given.

First Embodiment

A manufacturing method for a semiconductor device 1 including a MONOS type FET 54, having a charge storage film within a gate insulating film, for constituting a non-volatile memory, and three types of MOSFETs 51 to 53 of a high-voltage, a middle-voltage, and a low-voltage for constituting a logic circuit, a memory circuit, an analog circuit and the like will be described with reference to FIGS. 1 to 20.

Figure 1:
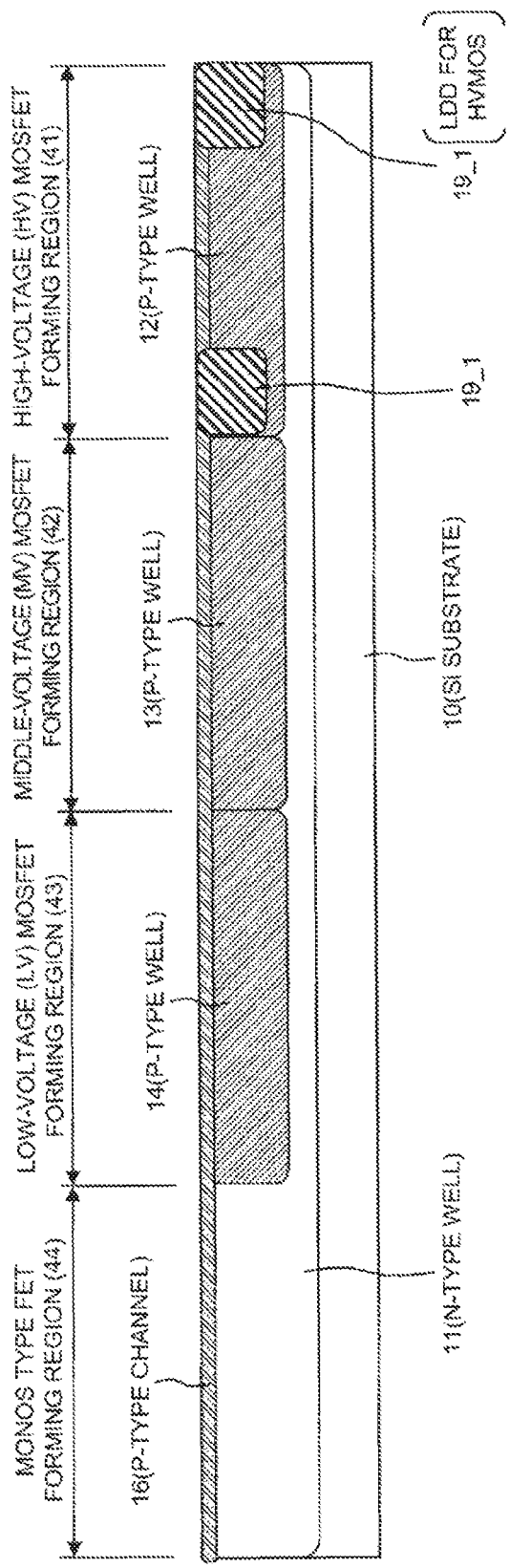
FIG. 1 is a schematic cross-sectional view illustrating a semiconductor device 1 in the course of a manufacturing method (after steps of forming an N-type well 11, P-type wells 12 to 14, a P-type channel 16, and an LDD 19_1 for a high-voltage (HV) MOSFET) according to a first embodiment.

FIG. 1 is a schematic cross-sectional view illustrating the semiconductor device 1 in the course of a manufacturing method (after steps of forming an N-type well 11, P-type wells 12 to 14, a P-type channel 16, and an LDD 19_1 for a high-voltage (HV) MOSFET) according to a first embodiment. In the drawing, a MONOS type FET forming region 44, a low-voltage (LV: Low Voltage) MOSFET forming region 43, a middle-voltage (MV) MOSFET forming region 42, and a high-voltage (HV) MOSFET forming region 41 are illustrated. Only a step of forming an N-channel FET is shown in each region. However, a step of forming a semiconductor region of a reverse conductivity type is added, and thus a P-channel FET may be formed so as to be configured as a CMOS (Complementally Metal Oxide Semiconductor) FET. In addition, only the P-channel FET may be formed.

First, donor impurities such as phosphorus (P) or arsenic (As) are introduced by ion implantation from the surface of a semiconductor substrate 10 (hereinafter, simply called the substrate 10) such as, for example, P-type silicon, to thereby form the N-type well 11. Next, openings of a resist film are sequentially formed in the respective regions 41 to 44 using a lithography technique, and acceptor impurities such a boron (B) are introduced into a region shallower than the N-type well 11 by ion implantation, to thereby sequentially form the P-type wells 12 to 14 in the formed openings. In case that a P-channel FET is further formed (not shown), an N-type well is further formed within the N-type well 11 or the P-type wells 12 to 14.

Next, the P-type channel 16 is formed by ion implantation in the vicinity of the entire surface of the substrate 10. In ion implantation for adjusting the impurity concentration of a channel region of an N-channel FET to be formed, the threshold voltage of the N-channel FET is adjusted. Here, the entire surface of the substrate 10 means the entire surface of a region in which an N-channel FET is formed. In case that a region having a P-channel FET formed therein is present, channel regions are sequentially formed in the respective regions using a lithography technique.

Next, the lightly doped drain (LDD) 19_1 is formed within a HVMOSFET forming region 41. The LDD 19 for a HVMOS can be formed as a lateral diffusion region for improving a drain breakdown voltage by alleviating an electric field between the drain and the gate of the HVMOSFET 51. The lateral diffusion region to be formed is opened using a lithography technique, and acceptor impurities such as boron (B) are introduced, for example, from the surface of the substrate 10 by ion implantation.

Figure 2:
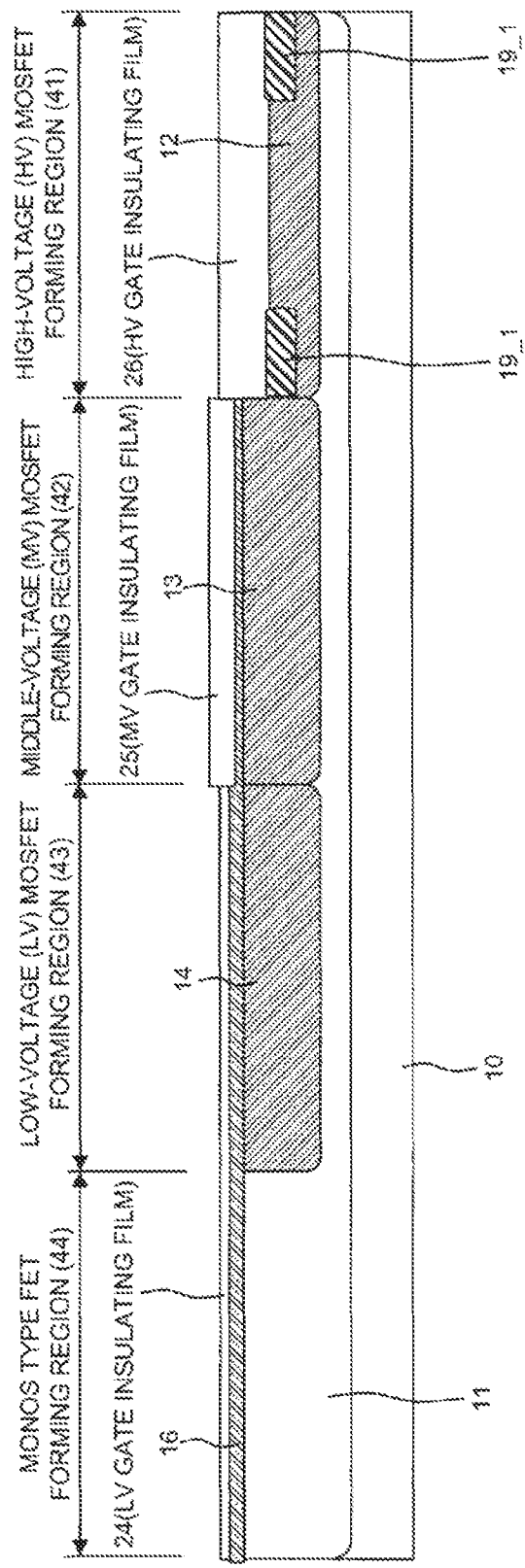
FIG. 2 is a schematic cross-sectional view illustrating the semiconductor device 1 in the course of a manufacturing method (after a step of forming gate insulating films 24 to 26) according to the first embodiment.

FIG. 2 is a schematic cross-sectional view illustrating the semiconductor device 1 after a step of forming gate insulating films 24 to 26 subsequent to the above-mentioned step. A groove having a predetermined depth is formed in the HVMOSFET forming region 41 on the substrate 10, and the gate insulating film 26 for the HVMOSFET 51 is formed in the groove by thermal oxidation. Next, the gate insulating film 25 for the MVMOSFET 52 is formed in the MVMOSFET forming region 42 by thermal oxidation. Next, the gate insulating film 24 for the LVMOSFET 53 is formed in the LVMOSFET forming region 43 by thermal oxidation. In this case, the gate insulating film 24 is also formed in the MONOS type FET forming region 44, but this film is removed by a step described later. For example, in order to thermally oxidize only a desired region of the silicon substrate, a silicon nitride film having an opening in the region is formed and is used as a hard mask, and a thermal oxidation step of oxidizing the crystal surface of the substrate exposed to the opening is performed. The thicknesses of the respective gate insulating films 26, 25, and 24 are set so as to satisfy the gate breakdown voltage of the MOSFETs 51, 52, and 53 having the respective breakdown voltages. The gate insulating film 26 of the HVMOSFET 51 is required to be formed thicker than the other gate insulating films 25 and 24 for the purpose of a high breakdown voltage. The depth of the groove formed in the substrate 10 before the substrate is thermally oxidized is finally set so that the heights of the respective gate insulating films 26, 25, and 24 are uniform. Although omitted in the above description, a groove may also be formed in the MVMOSFET forming region 42 in advance before the thermal oxidation step. Thereby, it is possible to make the heights of the gate insulating films 24 to 26 uniform, and to improve the yield rate of a wiring due to the stepped difference of the substrate 10 before a subsequent wiring step being reduced. Here, "make heights uniform" does not mean setting to exactly the same height. As the stepped difference becomes smaller, a defect density generated in the subsequent wiring step is reduced, and the yield rate improves.

Figure 3:
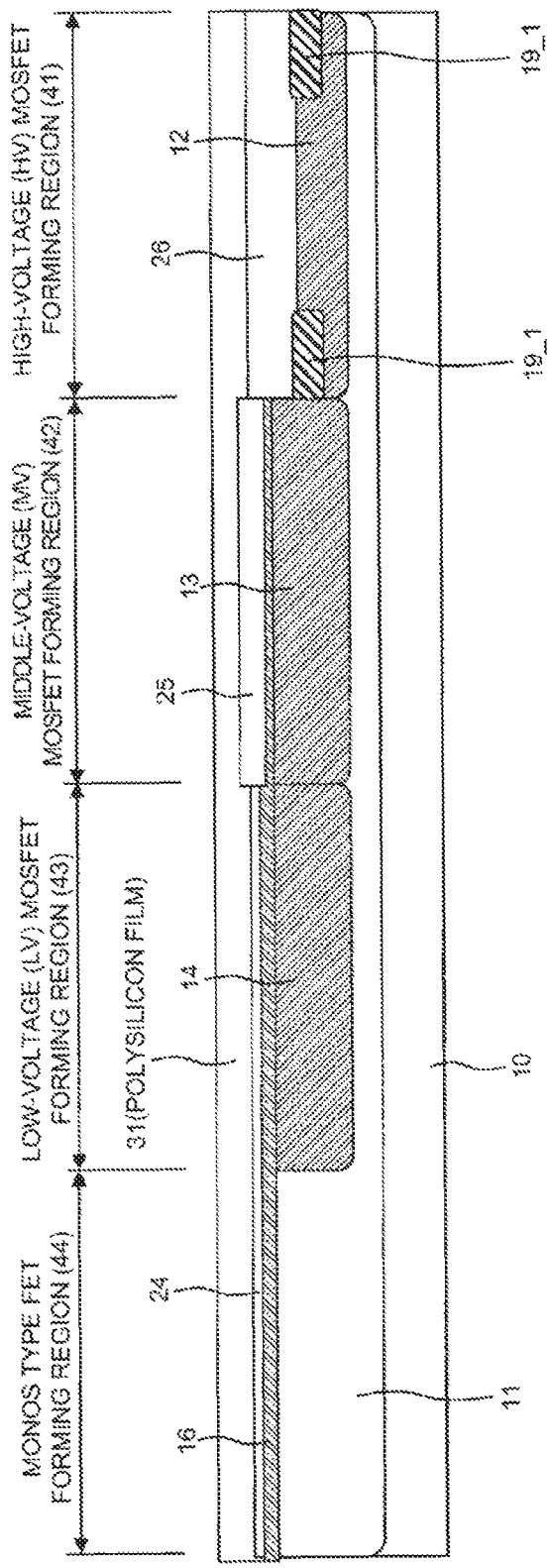
FIG. 3 is a schematic cross-sectional view illustrating the semiconductor device 1 in the course of a manufacturing method (after a step of forming a first gate electrode film 31) according to the first embodiment.

FIG. 3 is a schematic cross-sectional view illustrating the semiconductor device 1 after a step of forming a gate electrode film 31 subsequent to the above-mentioned step. A polysilicon film is deposited on the surface of the semiconductor device 1 shown in FIG. 2, for example, by a CVD (Chemical Vapor Deposition) method, to thereby form the gate electrode film 31. The polysilicon film is doped with impurities such as, for example, boron (B) or phosphorus (P) at a high concentration, and thus electric conductivity is lowered. Such impurity doping may be simultaneously performed in a CVD process of depositing the polysilicon film, and the impurities may be introduced by ion implantation or the like after film formation.

Figure 4:
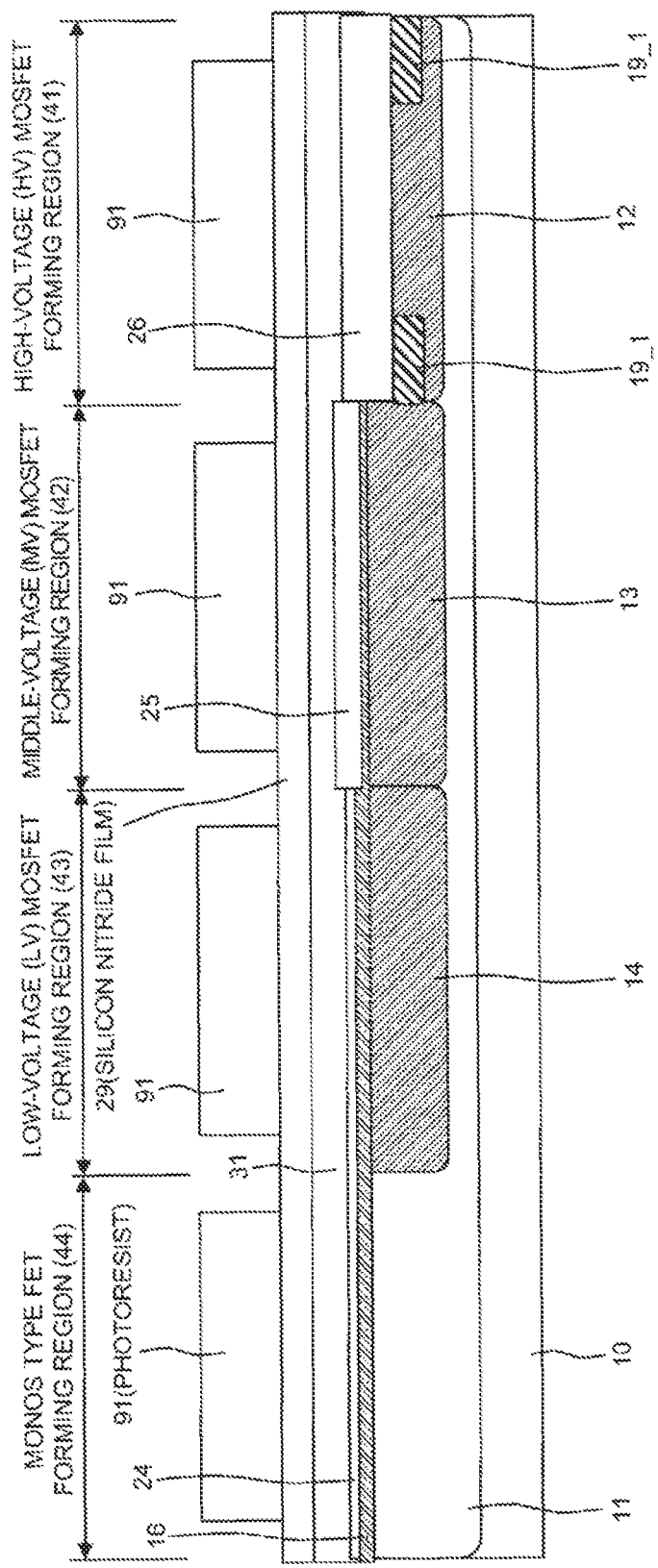
FIG. 4 is a schematic cross-sectional view illustrating the semiconductor device 1 in the course of a manufacturing method (after a step of forming a CMP (Chemical Mechanical Polish) stopper film 29, and a lithography process for forming an element isolation region 30) according to the first embodiment.

FIG. 4 is a schematic cross-sectional view illustrating the semiconductor device 1 after a step of forming a CMP stopper film 29 subsequent to the above-mentioned step and a lithography process for forming an element isolation region 30. The silicon nitride film 29 is deposited on the surface of the semiconductor device 1 shown in FIG. 3, for example, by a CVD method. The silicon nitride film 29 functions as a stopper in a subsequent CMP step. Next, a resist 91 having an opening in the element isolation region 30 is formed by lithography.

Figure 5:
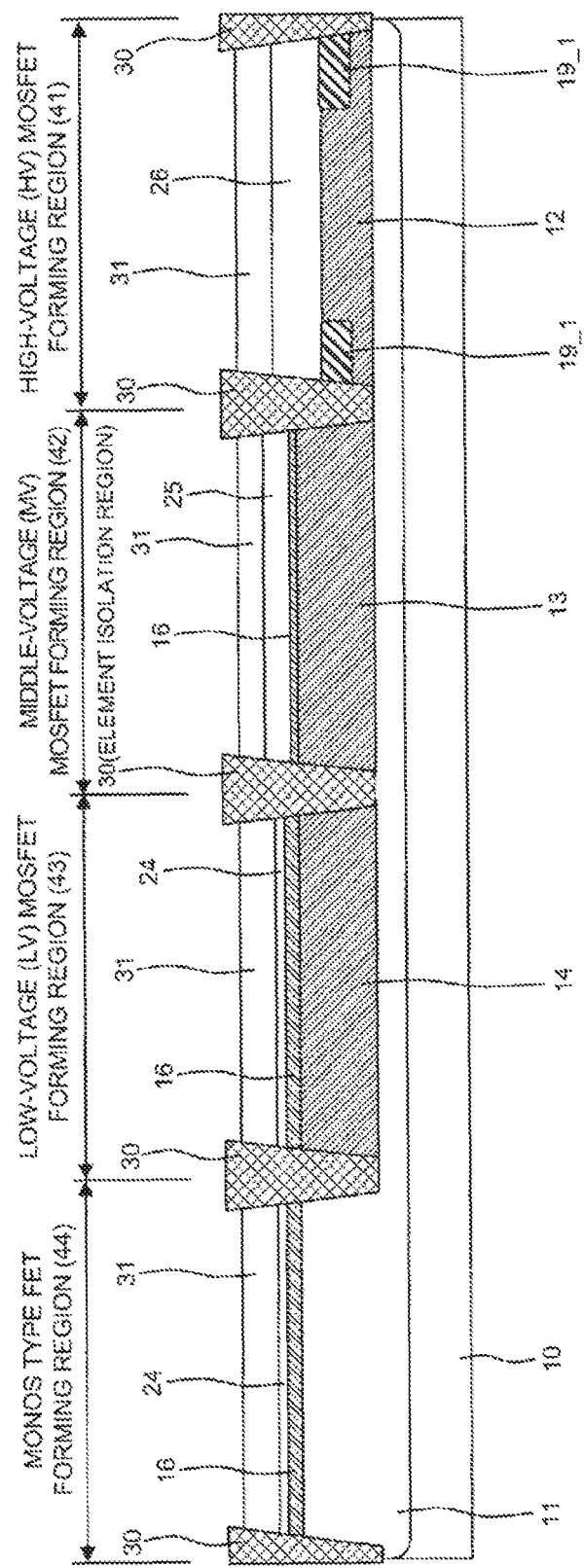
FIG. 5 is a schematic cross-sectional view illustrating the semiconductor device 1 in the course of a manufacturing method (after a step of forming the element isolation region 30) according to the first embodiment.

FIG. 5 is a schematic cross-sectional view illustrating the semiconductor device 1 after a step of forming the element isolation region 30 subsequent to the above-mentioned step. Anisotropic dry etching, for example, is performed on the semiconductor device 1 shown in FIG. 4, and thus a groove (trench) extending in the depth direction of the substrate 10 is formed in the opening of the resist 91. The groove is formed up to a position deeper than the wells 12 to 14. Next, after the resist 91 is removed, a silicon oxide film is deposited, for example, by a CVD method so as to bury the formed groove. In this case, the silicon oxide film is also deposited on the entire surface of the surface of the semiconductor device 1 in addition to the groove. Next, the surface of the semiconductor device 1 is polished by chemical mechanical polishing (CMP) until the silicon nitride film 29 is exposed. In this manner, the silicon nitride film 29 functions as a stopper film in the CMP. Next, the silicon nitride film 29 which is a stopper is removed by etching. This etching is high-selectivity etching having a high etching rate for the silicon nitride film 29, and a low etching rate for the silicon oxide film formed in the element isolation region 30 and the polysilicon film 31 located below the silicon nitride film 29. The STI 30 is formed in the element isolation region by the above steps. A plurality of elements formed within the respective transistor forming regions 41 to 44 are isolated from each other by the STI 30.

Figure 6:
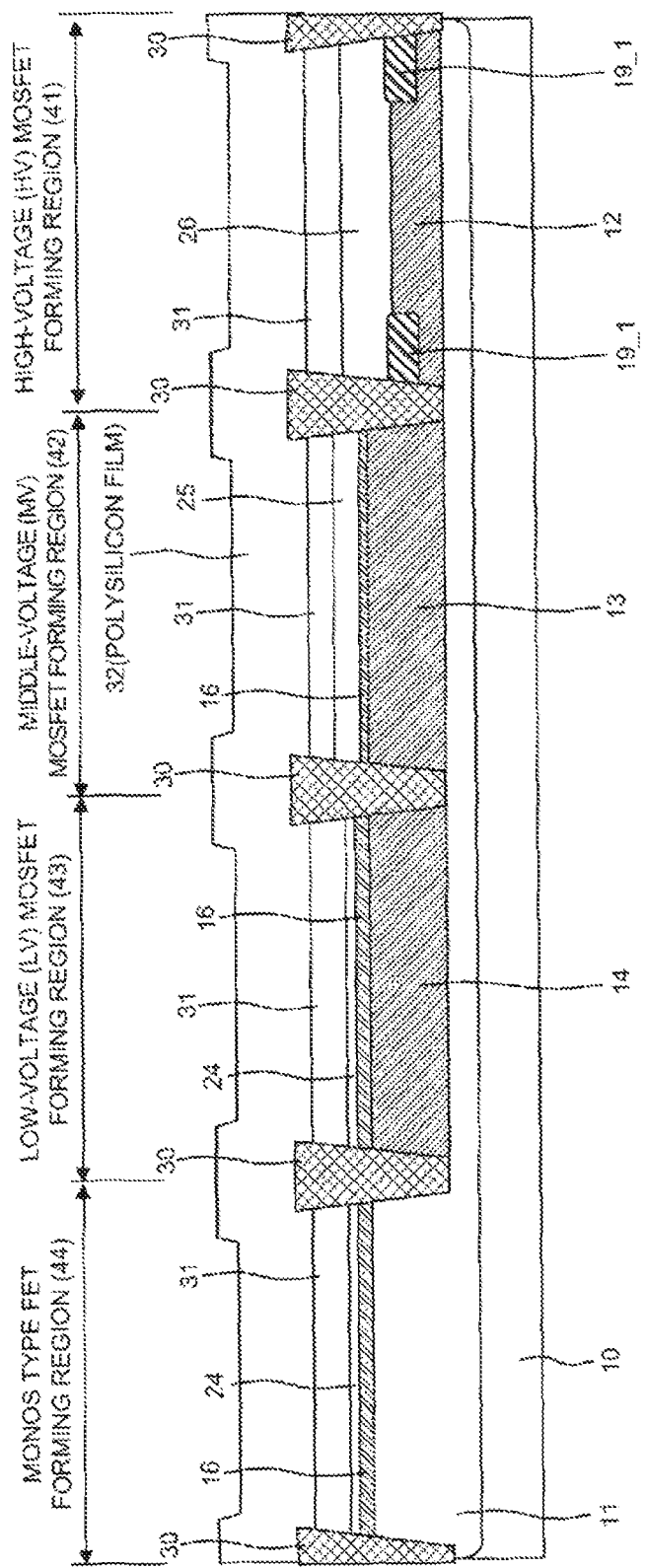
FIG. 6 is a schematic cross-sectional view illustrating the semiconductor device 1 in the course of a manufacturing method (after a step of forming a second gate electrode film 32) according to the first embodiment.

FIG. 6 is a schematic cross-sectional view illustrating the semiconductor device 1 after a step of forming a gate electrode film 32 subsequent to the above-mentioned step. A polysilicon film is deposited on the surface of the semiconductor device 1 shown in FIG. 5, for example, by a CVD method, and is doped with impurities such as phosphorus (P) at a high concentration to achieve a reduction in resistance, thereby allowing the gate electrode film 32 to be formed. The gate electrode film 32 is formed so as to cover not only the gate electrode film 31 formed in advance, but also the STI 30, and functions as a wiring to a gate electrode in an inactive region located on the STI 30.

Figure 7:
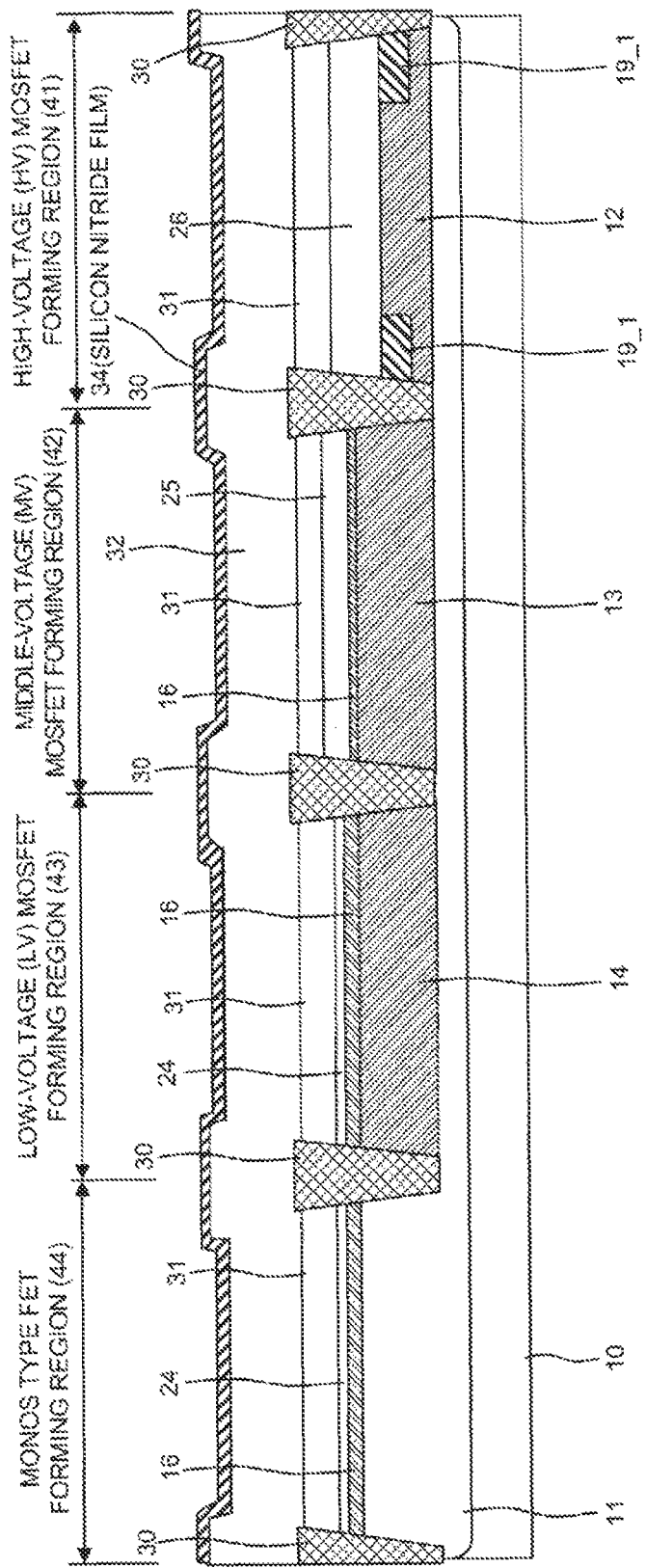
FIG. 7 is a schematic cross-sectional view illustrating the semiconductor device 1 in the course of a manufacturing method (after a step of forming an anti-oxidation film 34) according to the first embodiment.

FIG. 7 is a schematic cross-sectional view illustrating the semiconductor device 1 after a step of forming an anti-oxidation film 34 subsequent to the above-mentioned step. The silicon nitride film 34 is formed on the surface of the semiconductor device 1 shown in FIG. 6, that is, on the gate electrode film 32, for example, by a CVD method. This silicon nitride film 34 functions as an anti-oxidation film 34 that prevents the gate electrode film 32 from being oxidized in a subsequent step of forming a silicon oxide film.

Figure 8:
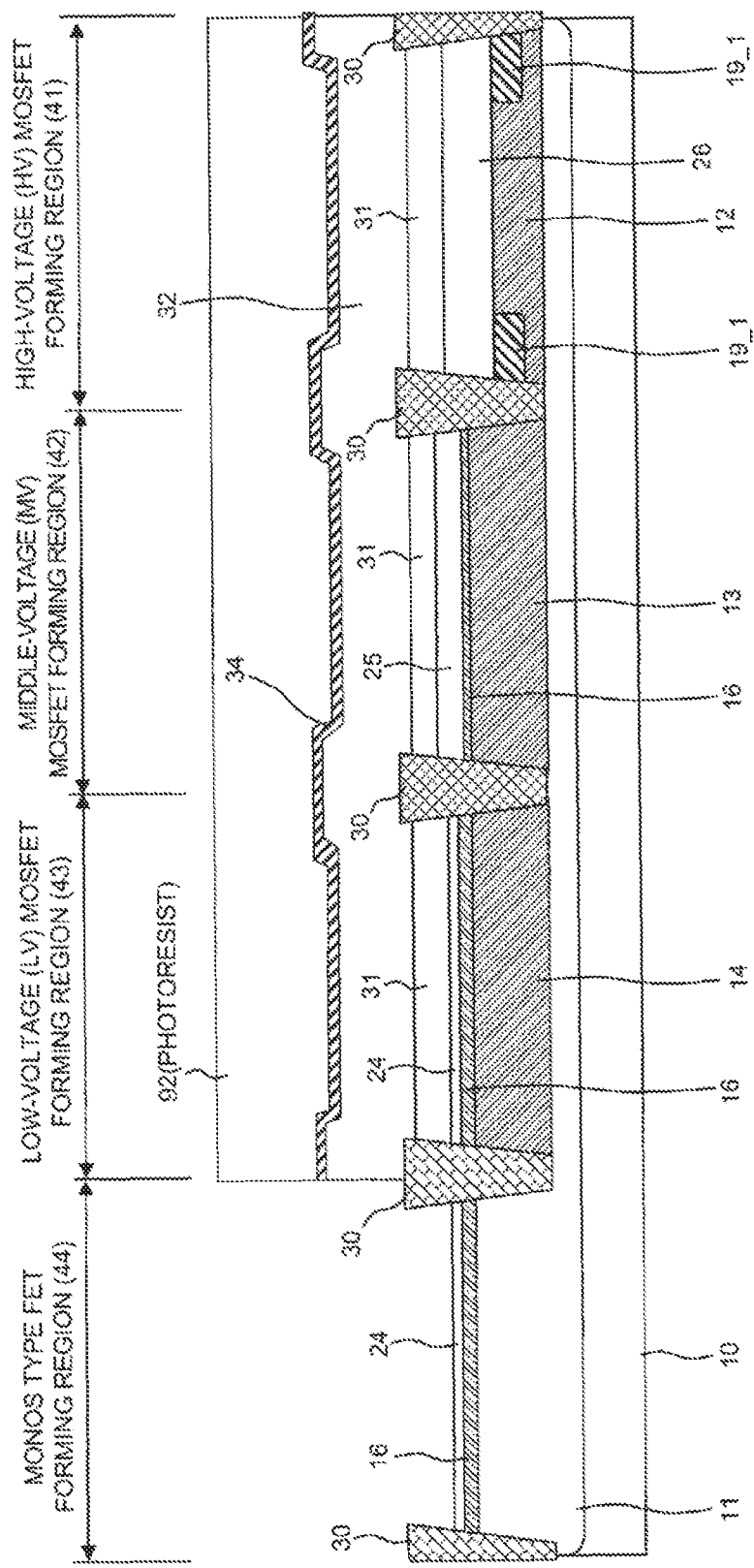
FIG. 8 is a schematic cross-sectional view illustrating the semiconductor device 1 in the course of a manufacturing method (after a lithography process for opening a non-volatile memory region) according to the first embodiment.

FIG. 8 is a schematic cross-sectional view illustrating the semiconductor device 1 after a lithography process for opening the non-volatile memory region (MONOS type FET forming region) 44 subsequent to the above-mentioned step. A resist is applied onto the surface of the semiconductor device 1 shown in FIG. 7, that is, on the anti-oxidation film 34, and the non-volatile memory MONOS type FET forming region 44 is opened by lithography. The anti-oxidation film 34 and the gate electrode films 32 and 31 are removed by etching, using a resist 92 having an opening in the MONOS type FET forming region 44 as a mask. This etching may be high-selectivity etching having a high etching rate for the anti-oxidation film 34 and the gate electrode films 32 and 31, that is, the silicon nitride film and polysilicon, and a low etching rate for the silicon oxide film formed in the element isolation region 30.

Figure 9:
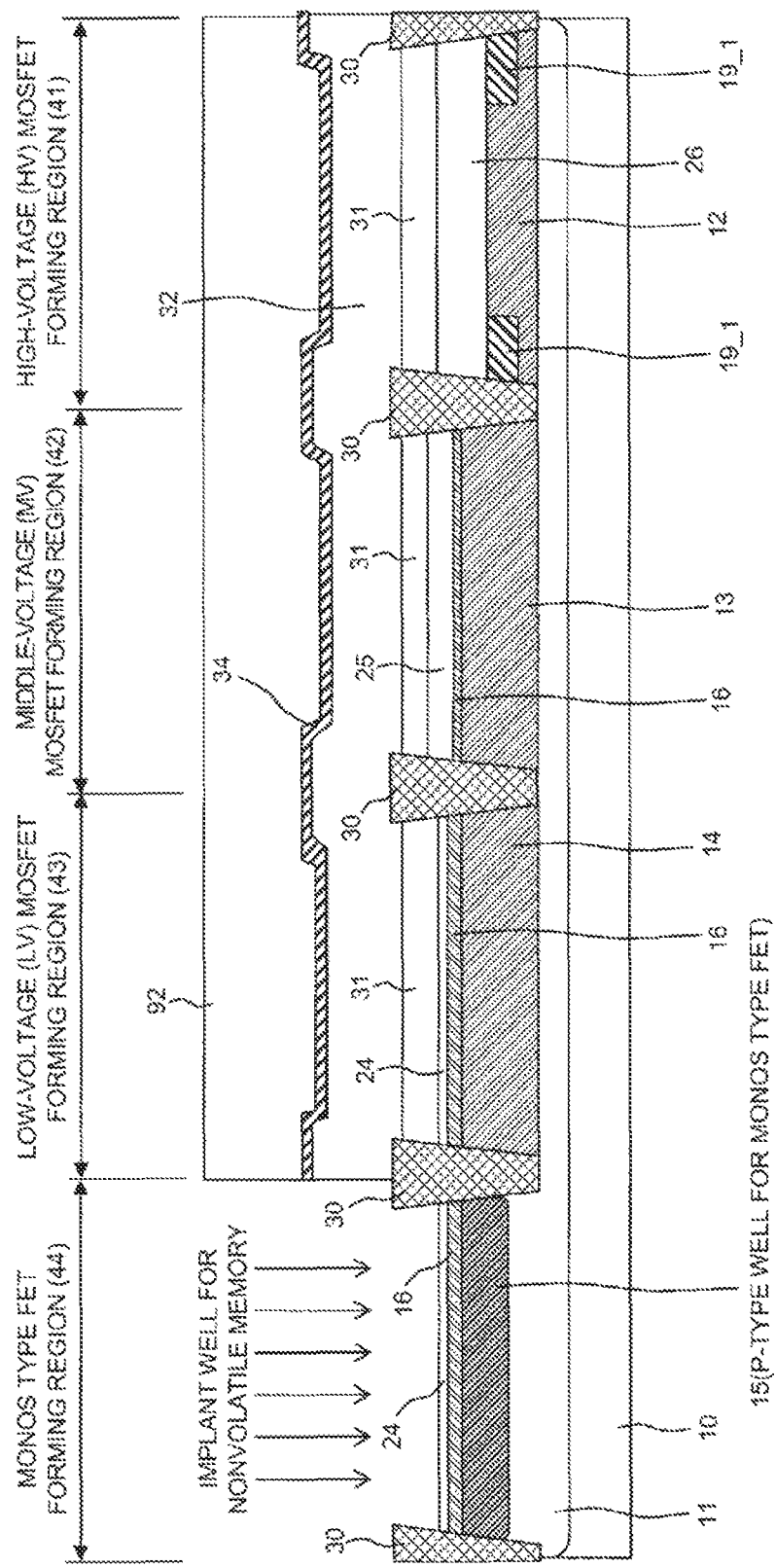
FIG. 9 is a schematic cross-sectional view illustrating the semiconductor device 1 in the course of a manufacturing method (after a step of forming a well 15 for a MONOS type FET 54) according to the first embodiment.

FIG. 9 is a schematic cross-sectional view illustrating the semiconductor device 1 after a step of forming a well 15 for the MONOS type FET 54 subsequent to the above-mentioned step. Acceptor impurities such as boron (B) are introduced from the surface of the semiconductor device 1 shown in FIG. 8 by ion implantation (well ion implantation), and thus the P-type well 15 for the MONOS type FET 54 is formed within the substrate 10 of the MONOS type FET forming region 44 in which the resist 92 is opened.

Figure 10:
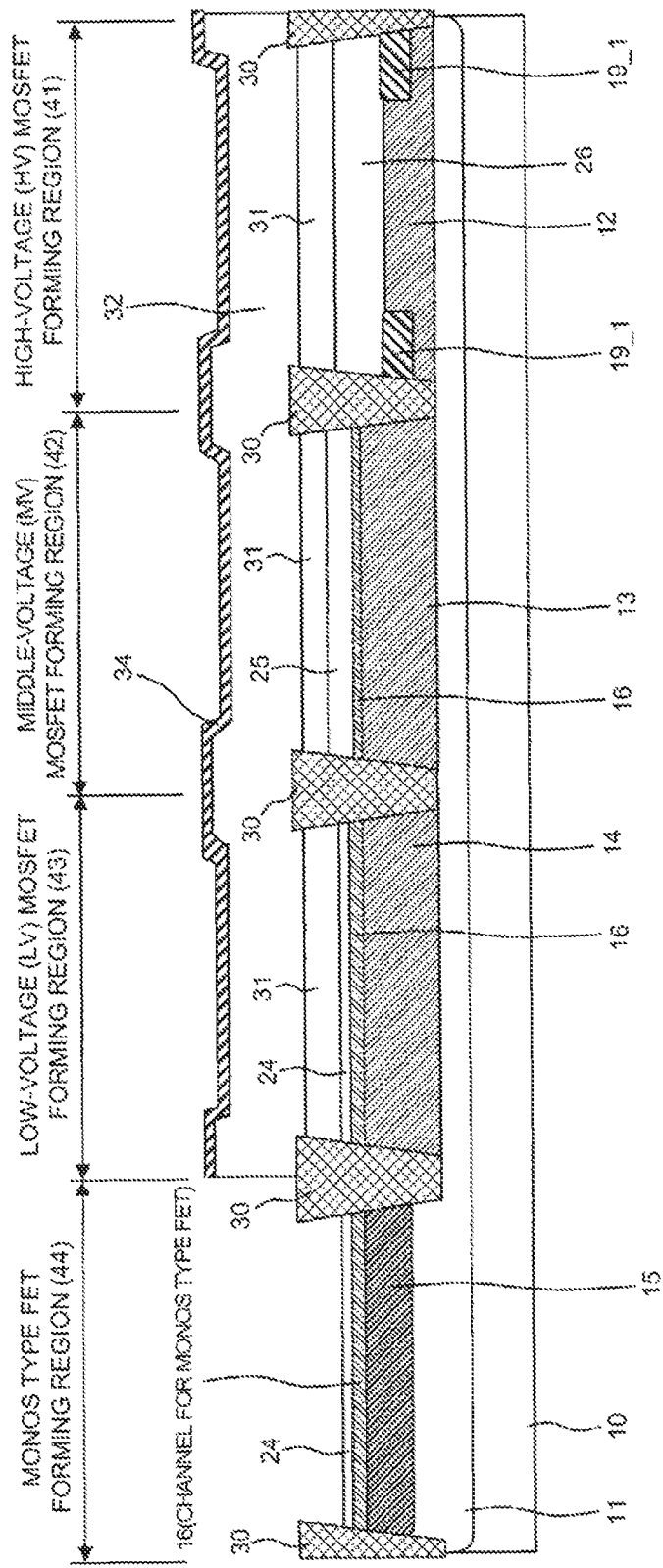
FIG. 10 is a schematic cross-sectional view illustrating the semiconductor device 1 in the course of a manufacturing method (after a channel ion implantation step of forming a channel 17 for the MONOS type FET 54) according to the first embodiment.

FIG. 10 is a schematic cross-sectional view illustrating the semiconductor device 1 after a channel ion implantation step of forming the channel 16 for the MONOS type FET 54 subsequent to the above-mentioned step. After the resist 92 is removed from the surface of the semiconductor device 1 shown in FIG. 8, impurities are introduced by ion implantation, and thus the channel region 16 for the MONOS type FET 54 is formed in the vicinity of the surface of the MONOS type FET forming region 44 within the substrate 10. The impurity concentration of the channel region is adjusted by this ion implantation (channel ion implantation), and the threshold voltage of the MONOS type FET 54 is adjusted. The resist 92 may be removed after the well ion implantation and before the channel ion implantation. Because the resist 92 not only serves as the anti-oxidation film 34 and an etching mask of the gate electrode 32, but also serves as a mask of the well ion implantation, a thick resist is desirable. In case where the thick resist 92 is removed, this is because organic foreign matter is attached to the surface of the substrate 10 of the MONOS type FET forming region 44 which is an opening, and scattered ions are prevented from being implanted into the substrate 10 during the ion implantation. In ion implantation of the well, ion acceleration energy is high, which leads to a relatively non-serious result. However, in the channel ion implantation, acceleration energy is low, which leads to a serious influence on element characteristics to such a large extent that ions may be prevented from being implanted into the substrate 10. For this reason, the resist 92 may be removed after the well ion implantation before the channel ion implantation. In a cleaning step (asking step) of removing the resist 92, foreign matter attached to the surface of the substrate 10 of the MONOS type FET forming region 44 may also be cleaned off and removed, and thus ions are not prevented from penetrating into the channel during ion implantation.

Figure 11:
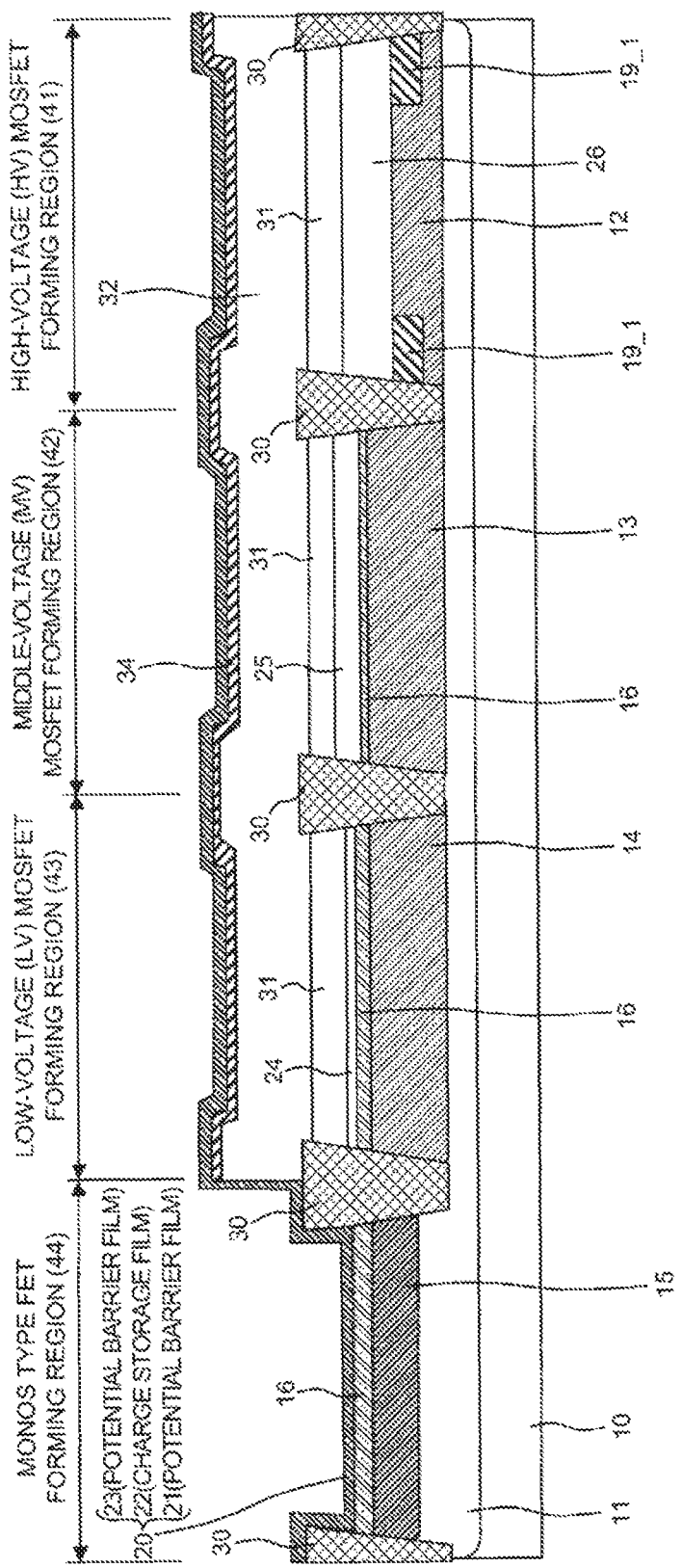
FIG. 11 is a schematic cross-sectional view illustrating the semiconductor device 1 in the course of a manufacturing method (after a step of forming a charge storage three-layer film 20 for the MONOS type FET 54 (potential barrier film 21, charge storage film 22, and potential barrier film 23)) according to the first embodiment.

FIG. 11 is a schematic cross-sectional view illustrating the semiconductor device 1 after a step of forming a charge storage three-layer film 20 for the MONOS type FET 54 (potential barrier film 21, charge storage film 22, and potential barrier film 23) subsequent to the above-mentioned step. The gate insulating film 24 is removed by etching from the MONOS type FET forming region 44 of the semiconductor device 1 shown in FIG. 10, and the potential barrier film 21, the charge storage film 22, and the potential barrier film 23 are sequentially formed on the surface of the semiconductor device 1. The potential barrier film 21 and the potential barrier film 23 are, for example, silicon oxide films, and the charge storage film 22 is, for example, a silicon nitride film. These films are formed by a CVD method. In this case, the charge storage three-layer film 20 is an ONO film. The charge storage film 22 may be a material, having a trap level, which traps carriers, and may be a silicon oxynitride film (SiON) in addition to a silicon nitride film (SiN, $Si_3N_4$). Further, a conductive film such as polysilicon may be used. However, in case that a conductive charge storage film is adopted, the film is desired to be formed as a high-quality insulating film having substantially no defects in the potential barrier film so that leakage of charge which is stored is suppressed.

In the MOSFET forming regions 41 to 43, in case that the silicon oxide film which is the potential barrier film 21 is deposited by a CVD method in a step of depositing the potential barrier film 21 on the gate electrode film 32, the formation of the anti-oxidation film 34 in advance substantially prevents oxygen radicals present during the CVD method from infiltrating into polysilicon which comprises the gate electrode film 32. Thereby, it is possible to substantially prevent the oxygen radicals in present during the CVD method from causing accelerated oxidation of polysilicon in the gate electrode film 31 located further down than the gate electrode film 32.

Figure 12:
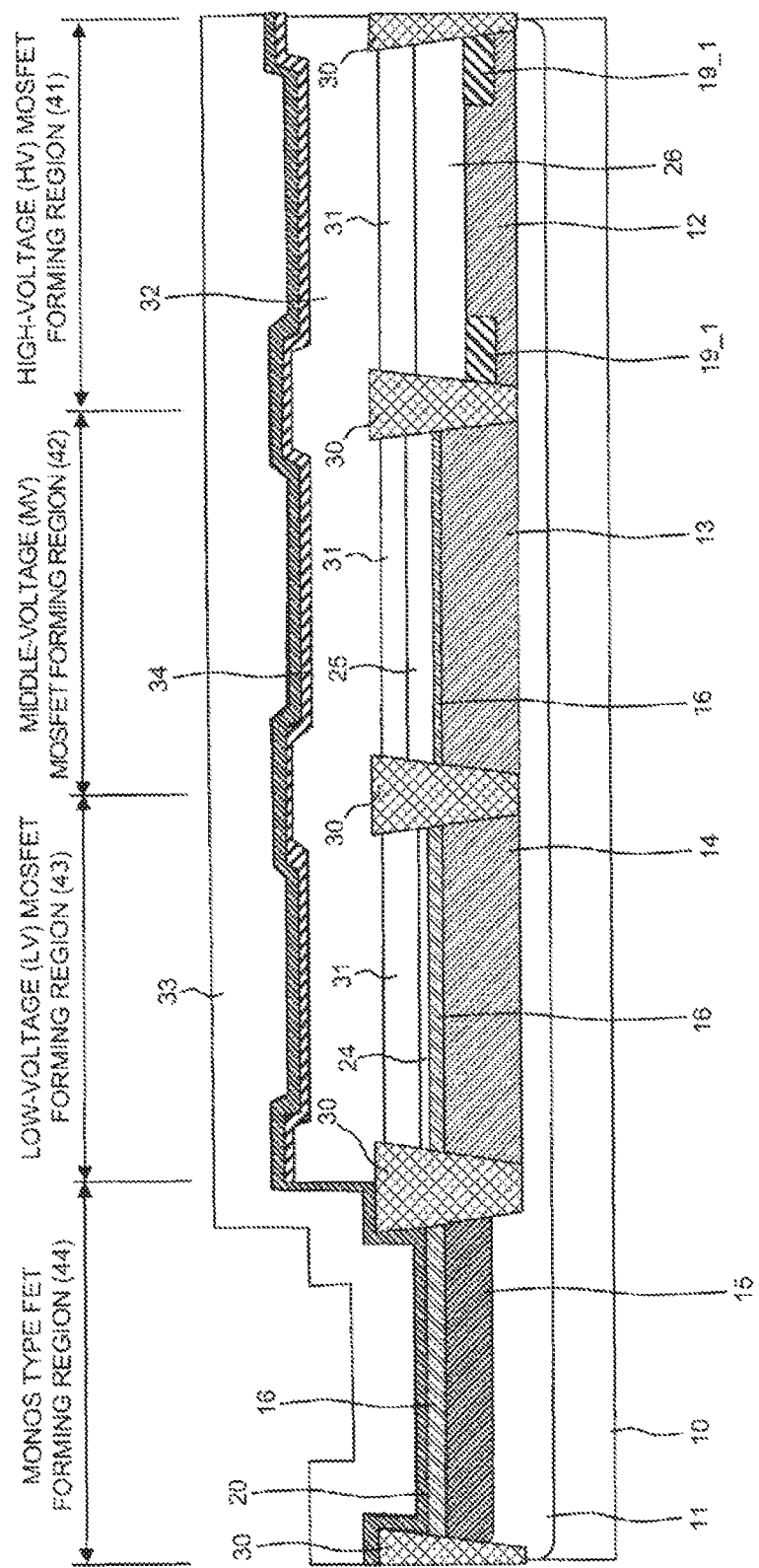
FIG. 12 is a schematic cross-sectional view illustrating the semiconductor device 1 in the course of a manufacturing method (after a step of forming a third gate electrode film 33) according to the first embodiment.

FIG. 12 is a schematic cross-sectional view illustrating the semiconductor device 1 after a step of forming a gate electrode film 33 subsequent to the above-mentioned step. A polysilicon film is deposited on the surface of the semiconductor device 1 shown in FIG. 11, for example, by a CVD method, and is doped with impurities such as phosphorus (P) at a high concentration to achieve a reduction in resistance, thereby allowing the gate electrode film 33 to be formed. The gate electrode film 33 serves as a gate electrode 64 of the MONOS type FET 54.

Figure 13:
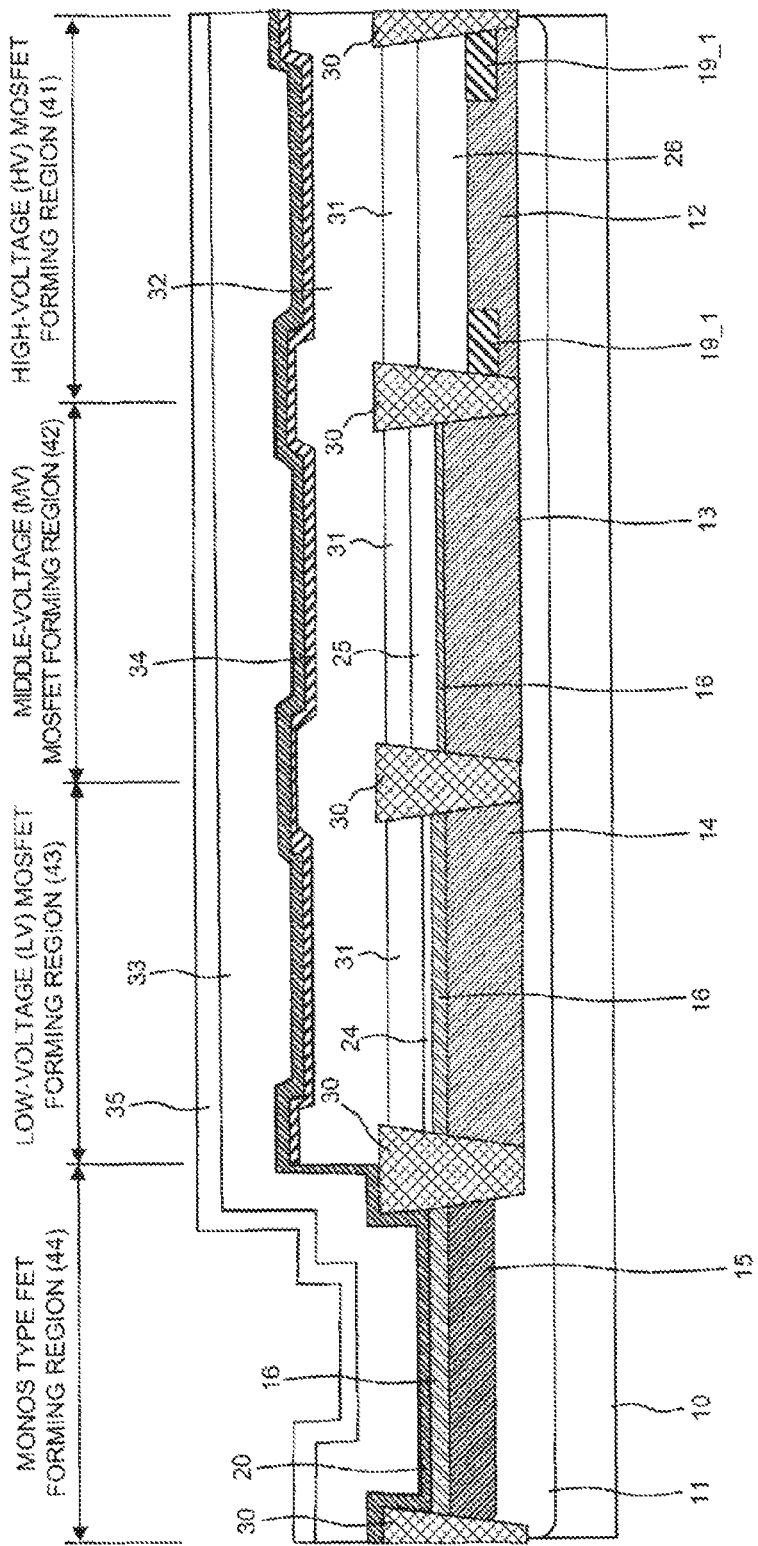
FIG. 13 is a schematic cross-sectional view illustrating the semiconductor device 1 in the course of a manufacturing method (after a step of forming a silicon oxide film 35) according to the first embodiment.

FIG. 13 is a schematic cross-sectional view illustrating the semiconductor device 1 after a step of forming a silicon oxide film 35 subsequent to the above-mentioned step. The silicon oxide film 35 is formed on the surface of the semiconductor device 1 shown in FIG. 12, for example, by a CVD method. In case that the thickness of a resist film located on the gate electrode 64 of the MONOS type FET 54 becomes excessively thin in a subsequent step described with reference to FIG. 18, the silicon oxide film 35 protects the gate electrode.

Figure 14:
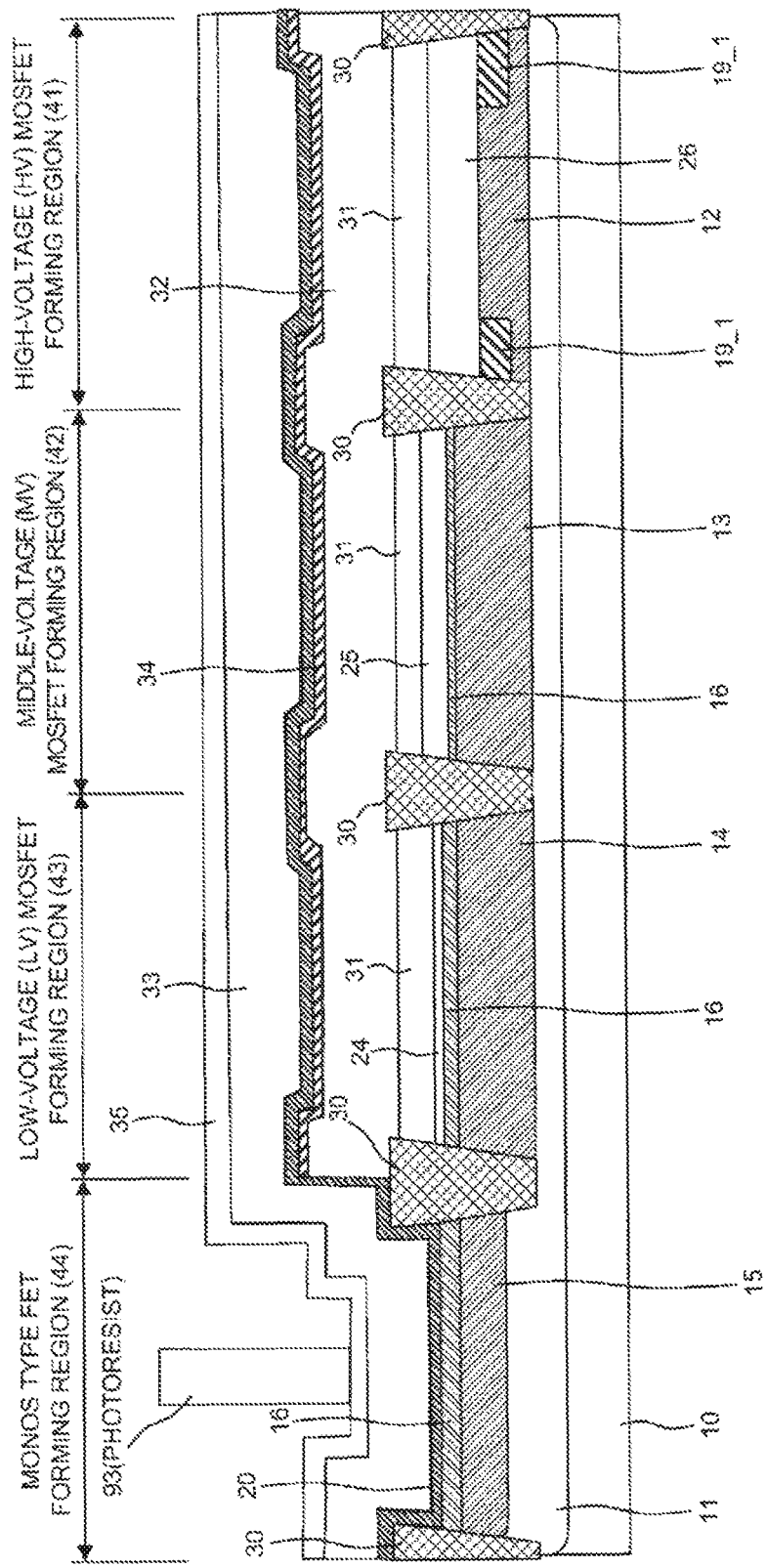
FIG. 14 is a schematic cross-sectional view illustrating the semiconductor device 1 in the course of a manufacturing method (after a lithography process for patterning a gate electrode 64 for the MONOS type FET 54) according to the first embodiment.

FIG. 14 is a schematic cross-sectional view illustrating the semiconductor device 1 after a lithography process for patterning the gate electrode 64 for the MONOS type FET 54 subsequent to the above-mentioned step. A resist 93 is formed, using lithography, in a portion in which the gate electrode 64 for the MONOS type FET 54 is formed, and a portion in which a wiring located on the same layer as the gate electrode 64 is formed.

Figure 15:
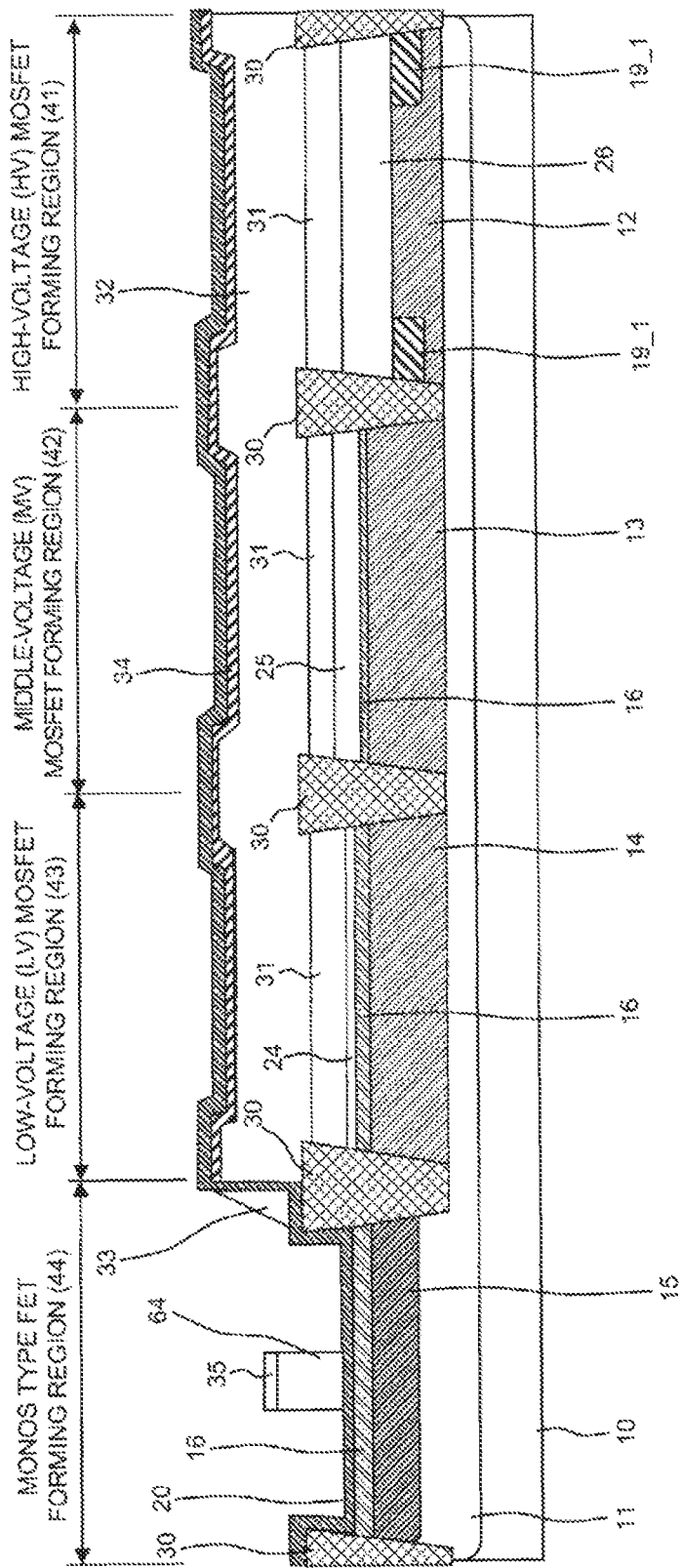
FIG. 15 is a schematic cross-sectional view illustrating the semiconductor device 1 in the course of a manufacturing method (after a step of etching the third gate electrode layer 33 in order to pattern the gate electrode 64 for the MONOS type FET 54) according to the first embodiment.

FIG. 15 is a schematic cross-sectional view illustrating the semiconductor device 1 after a step of etching the gate electrode layer 33 for patterning the gate electrode 64 for the MONOS type FET 54 subsequent to the above-mentioned step. The silicon oxide film 35 and the gate electrode layer 33 are removed by etching, using the resist 93 formed in the above-mentioned step as a mask. After etching, the resist 93 is also cleaned off and removed. In this case, the gate electrode 64 is constituted by two layers of the gate electrode layer 33 and the silicon oxide film 35.

Figure 16:
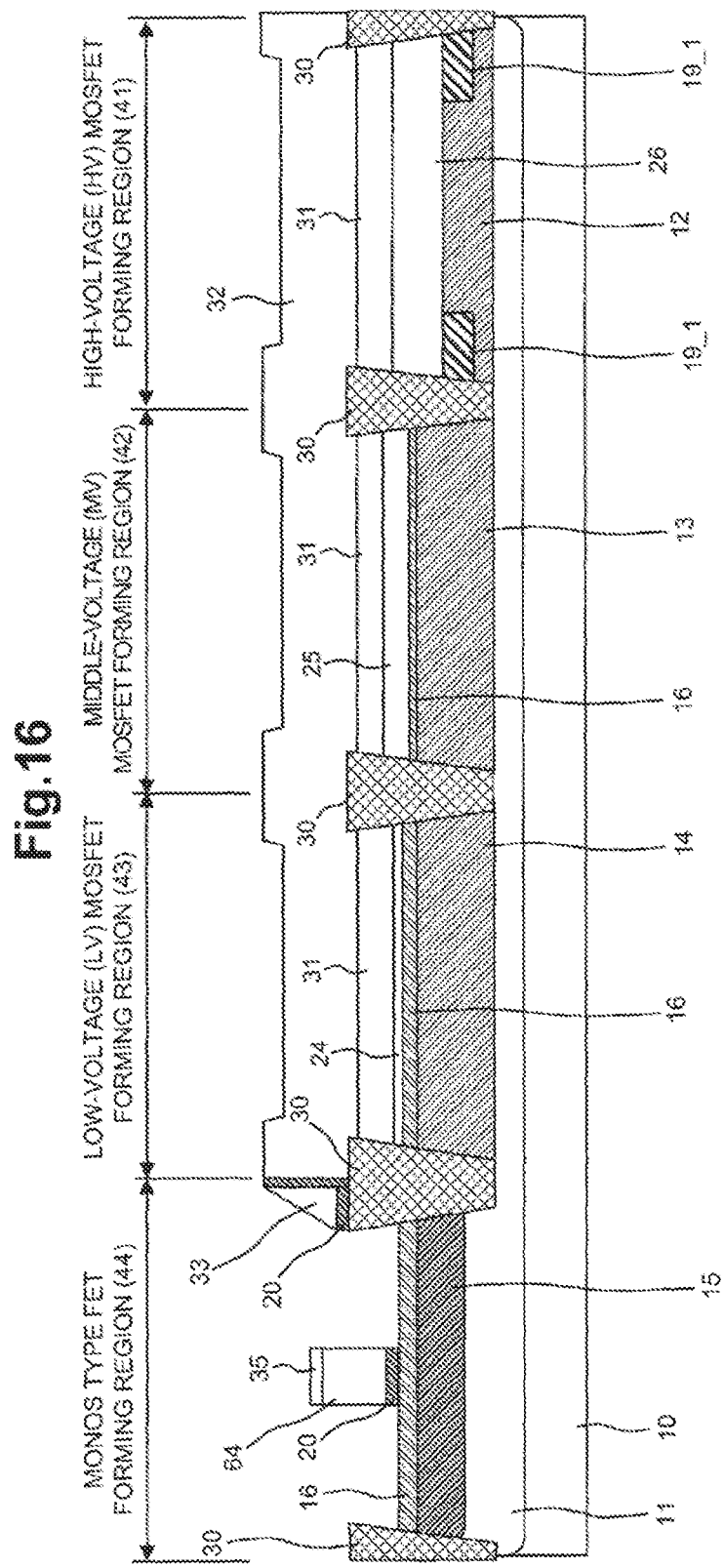
FIG. 16 is a schematic cross-sectional view illustrating the semiconductor device 1 in the course of a manufacturing method (after a step of etching the charge storage three-layer film 20 and the anti-oxidation film 34 in order to pattern the gate electrode 64 for the MONOS type FET 54) according to the first embodiment.

FIG. 16 is a schematic cross-sectional view illustrating the semiconductor device 1 after a step of etching the charge storage three-layer film 20 and the anti-oxidation film 34 for patterning the gate electrode 64 for the MONOS type FET 54 subsequent to the above-mentioned step. Using the gate electrode 64 patterned in the above-mentioned step as a hard mask, the ONO film which is the charge storage three-layer film 20 and the silicon nitride film which is the anti-oxidation film 34 formed thereunder in the MOSFET forming regions 41 to 43 are removed by etching. The silicon oxide film 35 formed on the gate electrode layer 33 in the gate electrode 64 functions as a protective film that prevents the gate electrode layer 33 from being damaged by this etching step.

Figure 17:
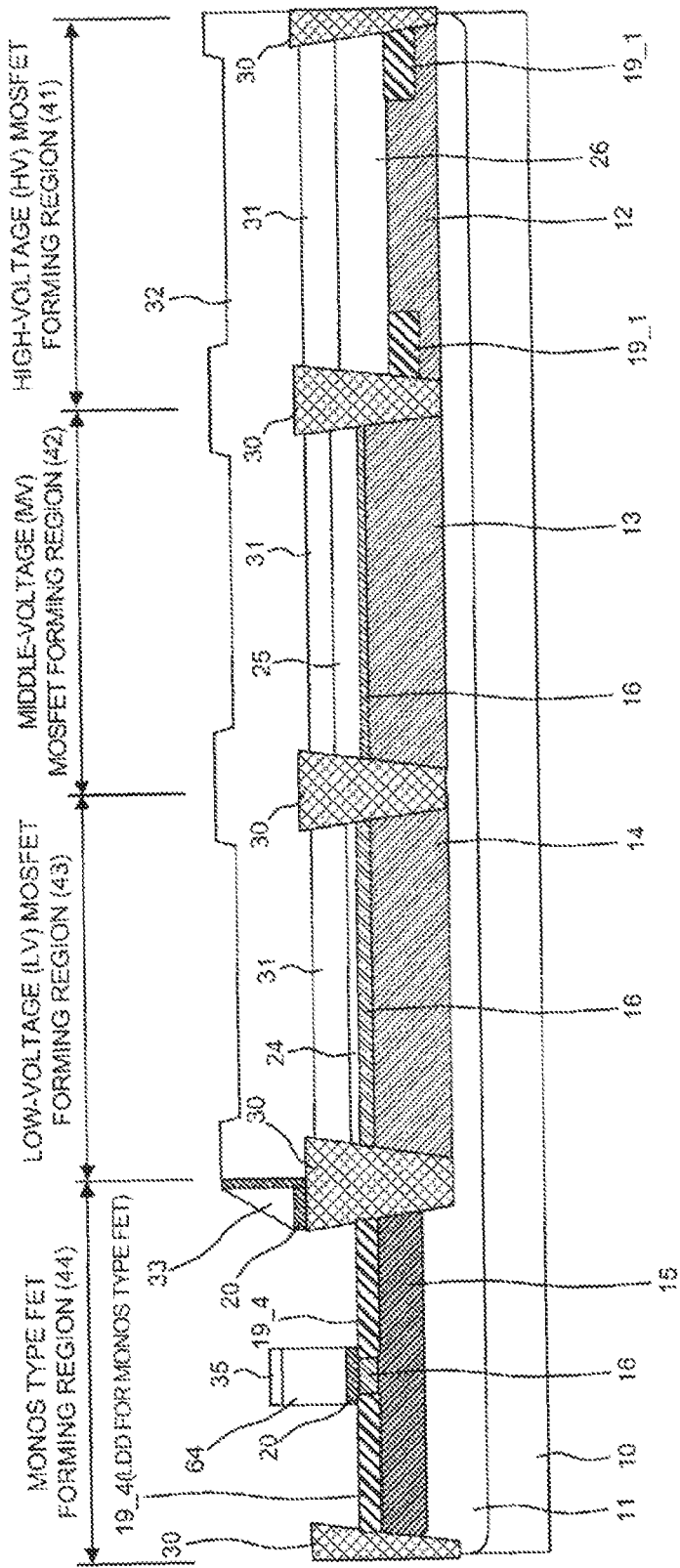
FIG. 17 is a schematic cross-sectional view illustrating the semiconductor device 1 in the course of a manufacturing method (after a step of forming a lightly doped drain 19_4 for the MONOS type FET 54) according to the first embodiment.

FIG. 17 is a schematic cross-sectional view illustrating the semiconductor device 1 after a step of forming a lightly doped drain 19_4 for the MONOS type FET 54 subsequent to the above-mentioned steps. The lightly doped drain (LDD) 19_4 for MONOS type FET 54 is formed by ion implantation of donor impurities such as, for example, phosphorus (P) or arsenic (As). In this ion implantation step, the gate electrode 64 also functions as a hard mask, and the LDD 19_4 is self-aligned on both sides of the gate electrode 64, and serves as a channel region of the MONOS type FET 54 just below the gate electrode 64.

Figure 18:
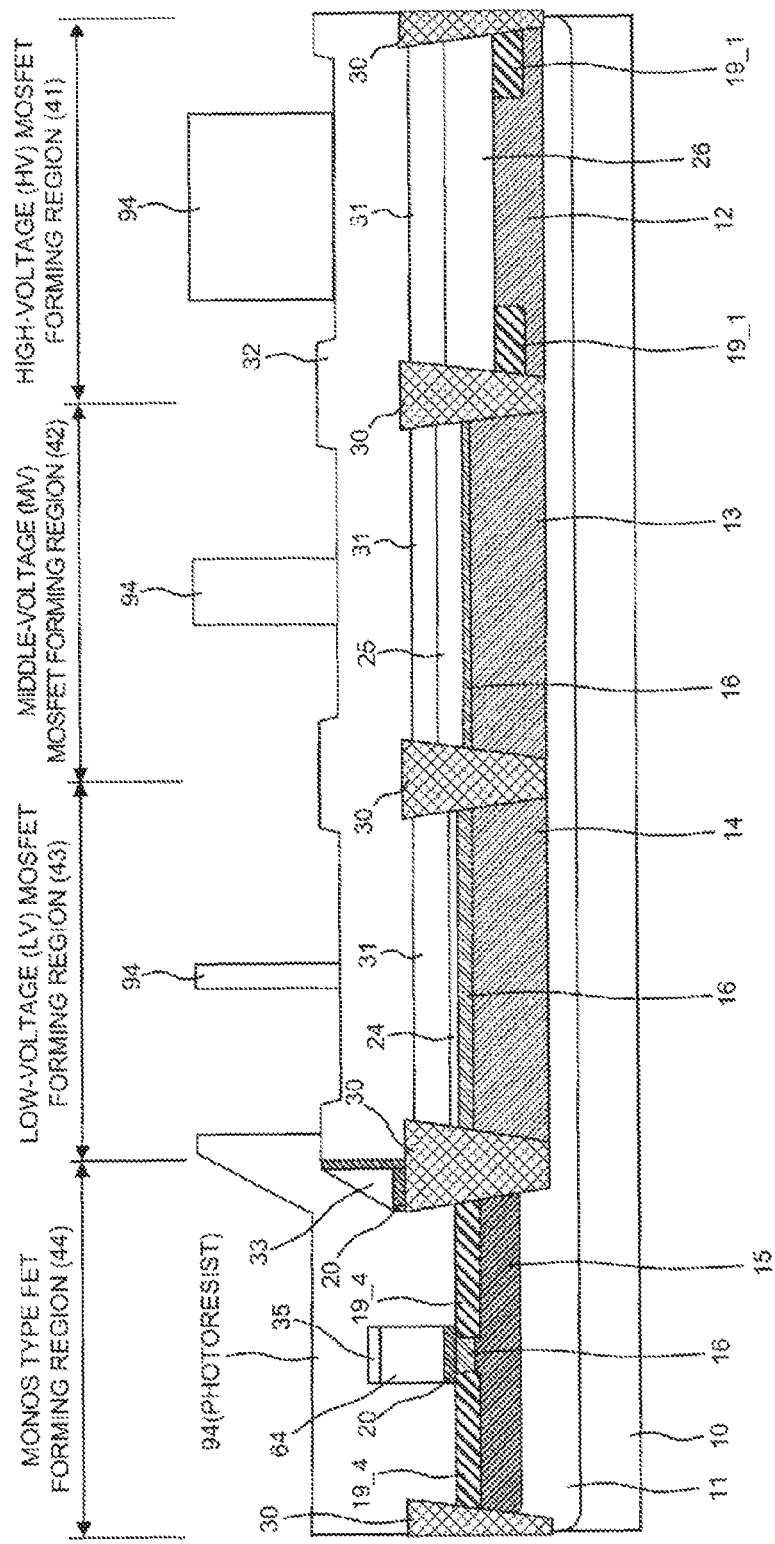
FIG. 18 is a schematic cross-sectional view illustrating the semiconductor device 1 in the course of a manufacturing method (after a lithography process for patterning gate electrodes 61 to 63 for a MOSFET) according to the first embodiment.

FIG. 18 is a schematic cross-sectional view illustrating the semiconductor device 1 after a lithography process for patterning gate electrodes 61 to 63 for a MOSFET subsequent to the above-mentioned step. A resist 94 is formed, using lithography, in portions in which the gate electrodes 61 to 63 for the MOSFETs 51 to 53 are formed, and a portion in which a wiring located on the same layer as the gate electrodes 61 to 63 is formed.

Figure 19:
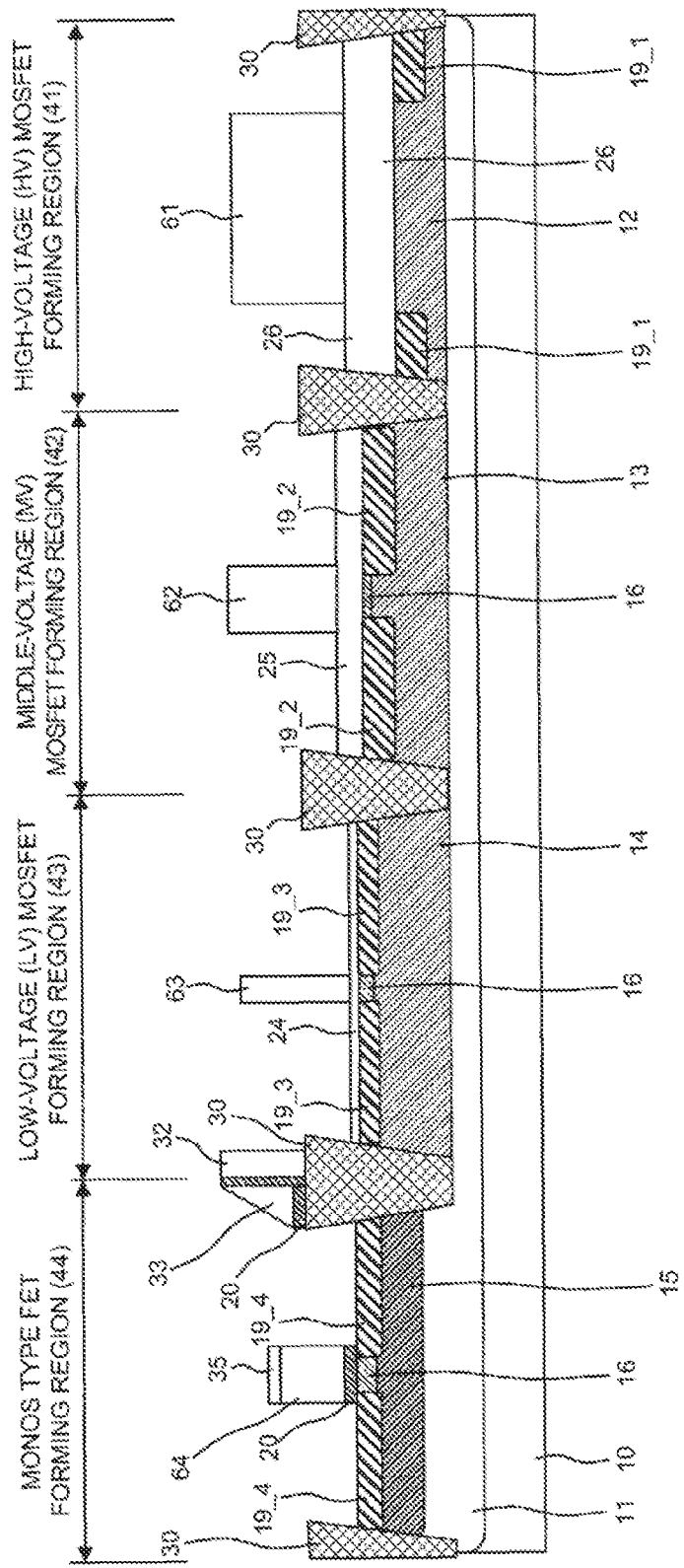
FIG. 19 is a schematic cross-sectional view illustrating the semiconductor device 1 in the course of a manufacturing method (after an etching step of forming the gate electrodes 61 to 63 for a MOSFET and a step of forming lightly doped drains 19_1 to 19_3) according to the first embodiment.

FIG. 19 is a schematic cross-sectional view illustrating the semiconductor device 1 after an etching step of forming the gate electrodes 61 to 63 for a MOSFET and a step of forming lightly doped drains (LDDs) 19_1 to 19_3 subsequent to the above-mentioned step. The gate electrode layers 31 and 32 are removed by etching, using the resist 94 formed in the above-mentioned step as a mask. After etching, the resist 94 is also cleaned off and removed. Next, the LDD 19_3 of the LVMOSFET 53 and the LDD 19_2 of the MVMOSFET 52 are formed by ion implantation of donor impurities such as, for example, phosphorus (P) or arsenic (As). In this ion implantation step, each of the gate electrodes 63 and 62 functions as a hard mask, the LDD 19_3 is self-aligned on both sides of the gate electrode 63, and serves as a channel region of the LVMOSFET 53 just below the gate electrode 63, and the LDD 19_2 is self-aligned on both sides of the gate electrode 62, and serves as a channel region of the MVMOSFET 52 just below the gate electrode 62.

Figure 20:
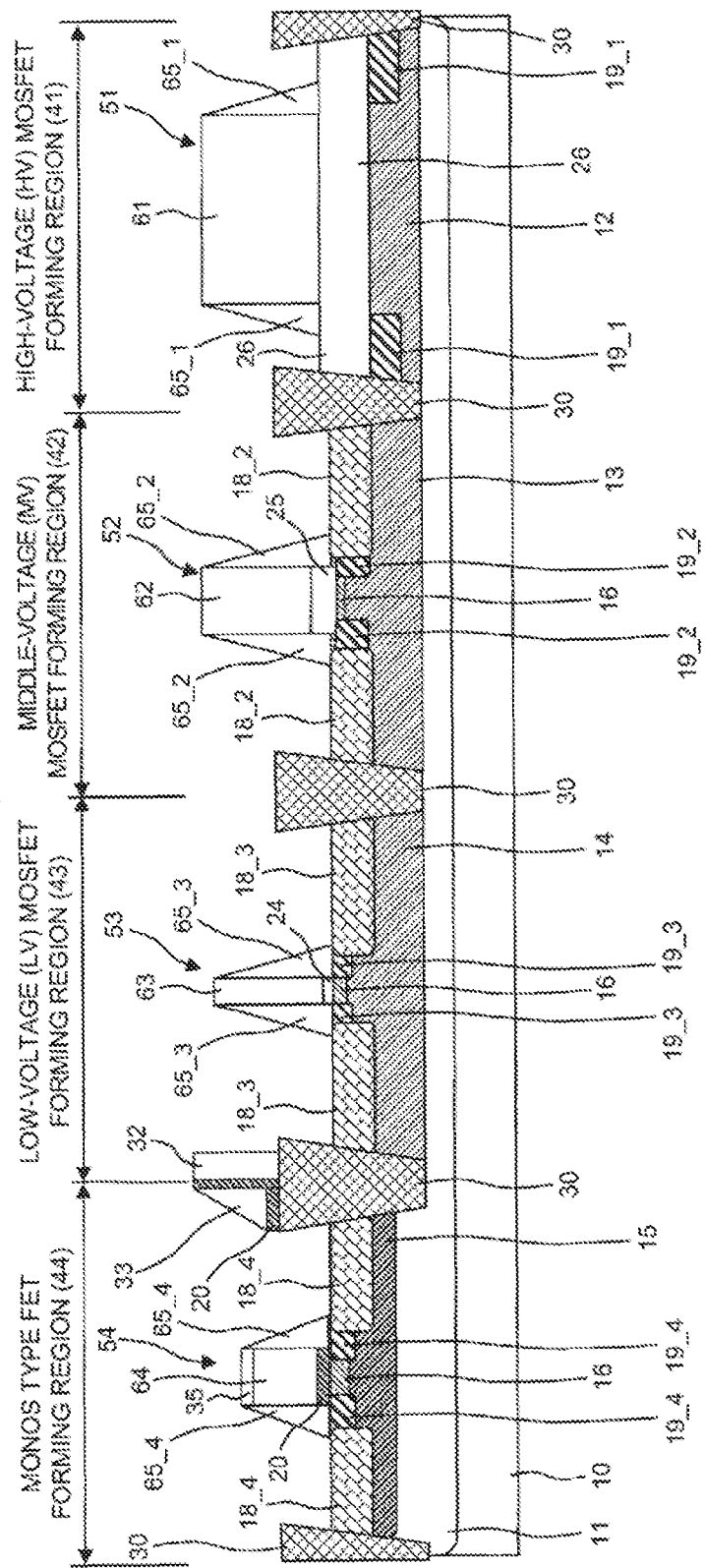
FIG. 20 is a schematic cross-sectional view illustrating the semiconductor device 1 in the course of a manufacturing method (after a step of forming gate sidewall insulating films (sidewalls) 65_1 to 65_4 and a step of forming source and drain regions 18_1 to 18_4) according to the first embodiment.

FIG. 20 is a schematic cross-sectional view illustrating the semiconductor device 1 after a step of forming gate sidewall insulating films (sidewalls) 65_1 to 65_4 and a step of forming source and drain regions 18_1 to 18_4 subsequent to the above-mentioned step. Each of the gate sidewall insulating films (sidewalls) 65_1 to 65_4 is formed on both sides of the gate electrodes 61 to 63 of the MOSFETs 51 to 53 and the gate electrode 64 of the MONOS type FET 54 which are formed in the above-mentioned steps. The gate sidewall insulating films 65_1 to 65_4 can be formed by isotropically depositing a silicon oxide film using, for example, a CVD method, and performing anisotropic etch in a vertical direction from the upper surface of the substrate. Using each of the gate electrodes 62 to 64 and the gate sidewall insulating films 65_2 to 65_4 of the MVMOSFET 52, the LVMOSFET 53, and the MONOS type FET 54 as a hard mask, the source and drain regions 18_2 to 18_4 are formed by performing ion implantation of donor impurities such as, for example, phosphorus (P) or arsenic (As). In the high-voltage HVMOSFET 51, particularly, since the drain is formed separately from the gate, the source and drain region 18_1 is specified and formed by lithography without being self-aligned with respect to the gate sidewall insulating film 65_1.

Thereafter, steps of forming an interlayer insulating film, a contact hole, a wiring and the like can be configured similarly using conventionally known manufacturing methods for a semiconductor device.

In the first embodiment described above, the lithography process can be used as, for example, photolithography in which light is used, and the resist in this case can be used as a photoresist, but the lithography process may be changed to other lithography of an electron beam or the like. In addition, the ion implantation step is associated with a heat treatment (annealing) step of recovering a crystal state after ion implantation, but the description thereof will not be given. The heat treatment (annealing) step may be performed each time corresponding to each ion implantation, and may be performed collectively one time with respect to ion implantation several times.

A technique relating to each characteristic embodiment which is adopted in the manufacturing method for a semiconductor device shown in the first embodiment will be described in more detail.

Second Embodiment

Formation of Charge Storage Film after Thermal Oxidation of Gate Oxide Film of High-Voltage MOSFET In a manufacturing method of forming multiple types of MOSFETs and MONOS type FETs ranging from a low-voltage to a high-voltage on the same semiconductor substrate, in case that a thermal oxide film having a large thickness is formed in order to form a high-voltage MOSFET, the characteristics of previously formed films may be changed, and thus there is a concern that the reliability IC semiconductor device being formed may be damaged. The reason is because, in case that a step is adopted in which an ONO film of a MONOS type FET and a polysilicon film which is a gate electrode film are first formed on the entire surface on the semiconductor substrate, a region in which a MOSFET is formed is opened thereafter, and then a thick gate oxide film of a high-voltage MOSFET is formed by thermal oxidation, a defect may occur in the previously formed ONO film.

In order to solve such a problem, a manufacturing method for a semiconductor device 1 according to a second embodiment is configured as follows.

A groove having a predetermined depth is formed in a region in which a high-voltage MOSFET on a semiconductor substrate is formed (step (b)), and an oxide film serving as a gate insulating film of the high-voltage MOSFET is formed within the formed groove by thermal oxidation (step (c)). For example, as described with reference to FIG. 2, the groove having a predetermined depth is formed in the high-voltage (HV) MOSFET forming region 41 on the substrate 10, and the gate insulating film 26 for the high-voltage (HV) MOSFET 51 is formed in the groove by thermal oxidation. In this case, the gate insulating film 24 for the low-voltage (LV) MOSFET 53 is formed in the low-voltage (LV) MOSFET forming region 43 by thermal oxidation (step (d)).

Thereafter, a gate electrode film of a low-voltage MOSFET is formed on the entire surface of the semiconductor substrate (step (e)). For example, as described with reference to FIG. 3, the gate electrode film 31 is formed on the surface of the semiconductor device 1 shown in FIG. 2, for example, by depositing a polysilicon film. As described with reference to FIG. 6, the gate electrode film 32 may be formed on the gate electrode film 31 by further depositing a polysilicon film. Thereby, the gate electrode layer of MOSFETs 51 to 53 serves as a so-called two-layer polysilicon structure.

Further, thereafter, a region having a non-volatile memory FET (MONOS type FET) formed therein is opened, and the semiconductor surface of the semiconductor substrate is exposed (step (i)). For example, as described with reference to FIG. 8, a resist is applied onto the surface of the semiconductor device 1 shown in FIG. 7, the region having the MONOS type FET 54 for a non-volatile memory formed therein is opened by lithography, and the semiconductor surface of the substrate 10 is exposed by etching.

Further, thereafter, a charge storage three-layer film is formed by sequentially depositing a first potential barrier film, a charge storage film, and a second potential barrier film (step (m)). For example, as described with reference to FIG. 11, the potential barrier film 21, the charge storage film 22, and the potential barrier film 23 are sequentially formed on the surface of the semiconductor device 1 shown in FIG. 10. The potential barrier film 21 and the potential barrier film 23 are, for example, silicon oxide films, and the charge storage film 22 is, for example, a silicon nitride film or a silicon oxynitride film. These films are formed by a CVD method.

In the above-mentioned first embodiment, as described with reference to FIGS. 8 and 9, an example is illustrated in which the opening where the semiconductor surface of the substrate 10 is exposed is formed in the MONOS type FET forming region 44 (step (i)), and then the well ion implantation and the channel ion implantation are performed (steps (j) and (l)), but these ion implantations may be performed in the step before then. For example, the ion implantations may be performed along with the step (step (a)) of performing the well ion implantation and the channel ion implantation for the MOSFETs 51 to 53 of the respective breakdown voltages as described with reference to FIG. 1.

Further, thereafter, a gate electrode film of a non-volatile memory FET is formed on the formed charge storage three-layer film (step (n)). For example, as described with reference to FIG. 12, the gate electrode film 33 is formed on the surface of the semiconductor device 1 shown in FIG. 11, for example, by depositing a polysilicon film.

Thereby, the charge storage three-layer film does not receive heat stress due to thermal oxidation for forming a gate oxide film of a high-voltage (HV) MOSFET, and thus, deterioration in the reliability of the semiconductor device can be suppressed.

In the above-mentioned first embodiment, a case in which STI is adopted as an element isolation region has been described, but another element isolation technique such as, for example, LOCOS (LOCal Oxidation of Silicon) may be adopted. In addition, an example has been described in which the STI is formed by a subsequent step of the step of forming the gate insulating films 24 to 26 of the MOSFETs 51 to 53, but the STI 30 may be formed before the gate insulating films 24 to 26 are formed.

The manufacturing method described in the first embodiment with respect to other respective steps is illustrative, and the second embodiment is not limited thereto.

Formation of Well for MONOS Type FET

In the above-mentioned second embodiment, as described with reference to FIGS. 8 and 9, the opening which exposes the semiconductor surface of the substrate 10 is formed in the region having the MONOS type FET 54 for a non-volatile memory formed therein, and then the well ion implantation and the channel ion implantation are performed (steps (j) and (l)). The ion implantations are performed in case that the well ion implantation for the MONOS type FET 54 is omitted in the step of performing the well ion implantation and the channel ion implantation for the MOSFETs 51 to 53 of the respective breakdown voltages (step (a)), and the opening of the region having the MONOS type FET 54 formed therein which is desired prior to the charge storage three-layer film (ONO film) is formed therein (step (m)) is instead formed (step (i)). In case that the well ion implantation for the MONOS type FET 54 is performed in the step (a), it is necessary to differentiate regions on which the ion implantation is performed by lithography for each well having a different impurity concentration.

By adopting the above-mentioned configuration, it is possible to form the well (third well, 15) of the MONOS type FET 54 for a non-volatile memory through the ion implantation using the opening formed by the step (i), and to reduce the number of lithography processes as compared to a case where the well of the non-volatile memory FET 54 is formed before the step (b), similarly to the step (a) of forming the well regions of the normal MOSFETs (51 to 53) of a first breakdown voltage or a second breakdown voltage.

Removal of Resist Before Formation of Channel for MONOS Type FET

The above-mentioned step (i) is a step of forming the resist 92 having an opening in the region 44 having the non-volatile memory FET 54 is formed therein, and exposing the semiconductor surface of the substrate 10 by etching. The resist 92 used for forming the opening may be cleaned off and removed (step (k)) after the well ion implantation of the step (j) and before the channel ion implantation of the step (l).

Thereby, it is possible to suppress the characteristic variation of the MONOS type FET 54. In case that the removal of the resist in the step (k) is neglected, in the ion implantation step of the step (j), there is a concern that organic foreign matter may be attached to the substrate surface, and an impurity concentration due to the ion implantation of the step (l) may vary between the elements. Since the foreign matter is also cleaned off and removed by the removal of the resist in the step (k), the variation of the impurity concentration in the channel of the MONOS type FET 54 is suppressed.

Third Embodiment

Prevention of Oxidation of Gate Electrode Film

In case that a manufacturing method is adopted in which a gate oxide film and a polysilicon film of a MOSFET are formed on the entire surface on the semiconductor substrate, and then a polysilicon film for forming an ONO film and a gate electrode of a MONOS type FET are formed, it is understood that a variation may occur in the threshold voltage of the MOSFET. Inventors have discovered that a silicon oxide film is formed on the polysilicon film formed in the step (e) which is a gate electrode film of the MOSFET, a variation may occur in the threshold voltage of the MOSFET on the P channel side. Inventors have ascertained, as a result of repeatedly examining experiments or the like, the facts such that the variation of the threshold voltage is conspicuous particularly in a low-voltage P channel MOSFET, does not occur in case that the formation of the ONO film is omitted experimentally, does not occur in a manufacturing method for forming the ONO film in advance, and the like. From these facts, inventors have found that in a step of forming a silicon oxide film on the polysilicon film which is a gate electrode layer, the polysilicon film is rapidly oxidized, and thus an impurity within the polysilicon film may be diffused up into the channel region of the MOSFET. The impurity within the polysilicon film is boron (B). In case that it is estimated that the impurity passes through the thin gate insulating film of the low-voltage P channel MOSFET, and reaches the channel, this coincides with the above experimental result.

A manufacturing method for a semiconductor device 1 according to a third embodiment in order to solve such a problem is a manufacturing method for a semiconductor device including a MONOS type FET and a MOSFET, and is configured as follows.

A gate oxide film is formed in a region having a MOSFET on the substrate formed therein (step (d)). For example, as described with reference to FIG. 2, the gate insulating film 24 is formed in a region having the LVMOSFET 53 on the substrate 10 formed therein. In this case, as described with reference to FIG. 2, the gate insulating films 26 and 25 of the other breakdown voltage MOSFETs 51 and 52 may be formed concurrently (almost in tandem).

Thereafter, subsequently to the step (d), a polysilicon film is formed in the region having the MOSFET formed therein (step (e)). For example, as described with reference to FIG. 3, the gate electrode film 31 is formed on the surface of the semiconductor device 1 shown in FIG. 2, for example, by depositing a polysilicon film. As described with reference to FIG. 6, the gate electrode film 32 may be formed by further depositing a polysilicon film on the gate electrode film 31. Thereby, the gate electrode layer of the MOSFETs 51 to 53 is formed of a so-called two-layer polysilicon structure.

Further, thereafter, subsequently to the step (e), an anti-oxidation film is formed on the polysilicon film which is a gate electrode film (for example, gate electrode film 31 or gate electrode film 32 in a case of two-layer polysilicon) (step (h)). For example, as described with reference to FIG. 7, the silicon nitride film 34 is formed on the surface of the semiconductor device 1 shown in FIG. 6, that is, on the gate electrode film 32 by a CVD method. This silicon nitride film 34 functions as the anti-oxidation film 34 that prevents the gate electrode film 32 from being oxidized in a subsequent step of forming a silicon oxide film. In case that the gate electrode layer is not formed of a so-called two-layer polysilicon structure, the anti-oxidation film 34 is formed directly on the gate electrode film 31. Here, an example is shown in which the anti-oxidation film 34 is formed of a silicon nitride film, but materials capable of preventing radical oxygen from infiltrating into the gate electrode film 32 (or 31) in the subsequent step of forming a silicon oxide film may be used, and, silicate compounds such as, for example, hafnium (Hf), zirconium (Zr), aluminum (Al), or titanium (Ti) may be used.

Further, thereafter, subsequently to the step (h), the region having the MONOS type FET formed therein is opened, and the semiconductor surface of the semiconductor substrate is exposed (step (i)). For example, as described with reference to FIG. 8, a resist is applied onto the surface of the semiconductor device 1 shown in FIG. 7, the region having the MONOS type FET 54 for a non-volatile memory formed therein is opened by lithography, and the semiconductor surface of the substrate 10 is exposed by etching.

Further, thereafter, subsequently to the step (i), a charge storage three-layer film is formed by sequentially depositing a first potential barrier film, a charge storage film, and a second potential barrier film (step (m)). For example, as described with reference to FIG. 11, the potential barrier film 21, the charge storage film 22, and the potential barrier film 23 are sequentially formed on the surface of the semiconductor device 1 shown in FIG. 10. The potential barrier film 21 and the potential barrier film 23 are, for example, silicon oxide films, and the charge storage film 22 is, for example, a silicon nitride film (SiN, $Si_3N_4$) or a silicon oxynitride film (SiON). These films are formed by a CVD method.

Thereby, even in case that a manufacturing method is adopted in which a gate oxide film and a polysilicon film of a MOSFET are formed on the entire surface on the semiconductor substrate, and then an ONO film of the MONOS type FET and a polysilicon film which is a gate electrode film are formed, it is possible to suppress the occurrence of a variation in the threshold voltage of the MOSFET.

The manufacturing method described in the first embodiment with respect to other respective steps is illustrative, and the third embodiment is not limited thereto.

Fourth Embodiment

Channel Ion Implantation from Both Oblique Directions

Figure 21:
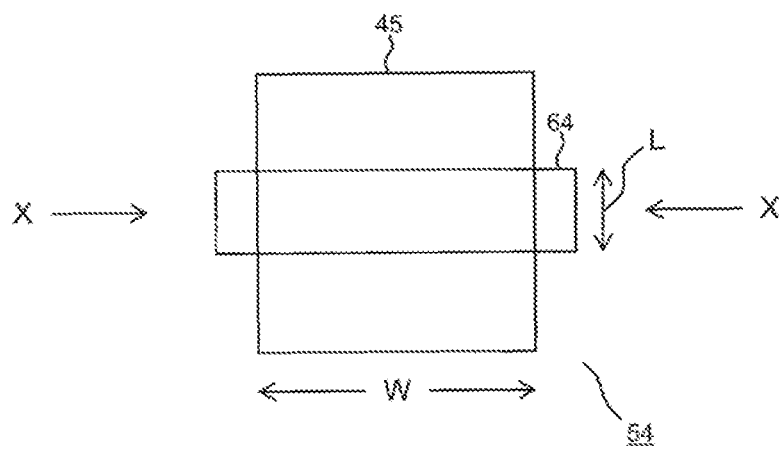
FIG. 21 is a schematic layout pattern diagram in case that the MONOS type FET 54 is viewed from an upper surface.

FIG. 21 is a schematic layout pattern diagram in case that the MONOS type FET 54 is viewed from the upper surface.

The MONOS type FET 54 constituting a non-volatile memory is formed in a region 45 surrounded by the element isolation region 30 such as, for example, STI, the gate electrode 64 is formed from one STI 30 across the other STI 30 in the direction of a channel width (W), and a source region and a drain region are formed with the gate electrode 64 interposed therebetween. For this reason, an inside current channel away from the sidewall of the STI 30 and a current channel on both sides formed along the channel in the vicinity of the sidewall are present in the direction of a channel length (L). The inventors have found that in the vicinity of the sidewall of the STI 30, since an impurity concentration becomes non-uniform or the disturbance of an electric field occurs, there may be a concern of so-called kink characteristics being shown in which a threshold voltage for controlling the current channel on both sides and a threshold voltage for controlling the inside current channel are effectively different from each other. In the non-volatile memory, since information is stored by a change in the threshold voltage of the MONOS type FET, there may be a concern that the kink characteristics make a write margin smaller.

Figure 26:
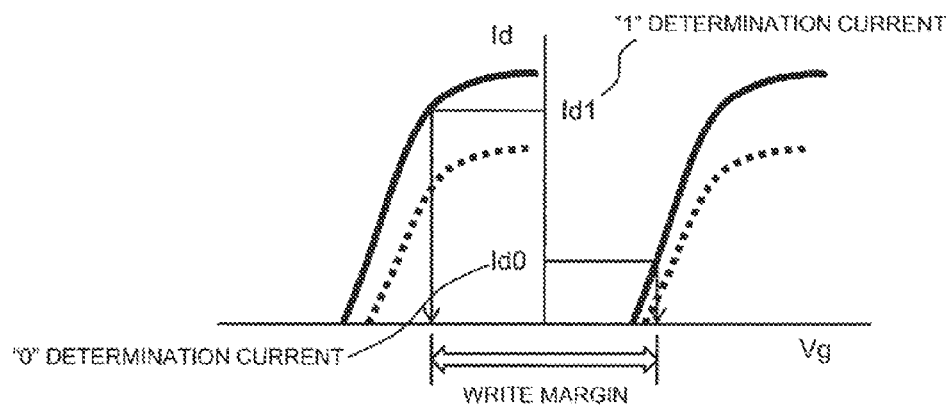
FIG. 26 is a diagram illustrating the normal electrical characteristics of the MONOS type FET 54.

FIG. 25 is a diagram illustrating the electrical characteristics of the MONOS type FET 54 having kink characteristics, and FIG. 26 is a diagram illustrating the normal electrical characteristics of the MONOS type FET 54. The MONOS type FET 54 constituting a non-volatile memory has characteristics that a threshold voltage fluctuates depending on whether carriers are trapped in the charge storage layer, and stores information using the characteristics. In FIGS. 25 and 26, the horizontal axis is a gate voltage and the vertical axis is a drain current, and the static characteristics of the MONOS type FET 54 in respective cases that carriers are trapped and are not trapped are illustrated. Solid lines are the characteristics of a drain current in the inside current channel away from the sidewall of the STI 30, broken lines are the characteristics of a drain current in the current channel both sides in the vicinity of the sidewall of the STI 30, and actual static characteristics are the sum (not shown) of the solid line and the broken line. In the normal electrical characteristics shown in FIG. 26, a threshold voltage for controlling the current channel on both sides and a threshold voltage for controlling the inside current channel are coincident with each other. However, in the electrical characteristics shown in FIG. 25, since the threshold voltage for controlling the current channel on both sides is lower than normal, and is different from the threshold voltage for controlling the inside current channel, a place having a sharp change in kink, that is, inclination appears in the static characteristics which are the sum (not shown) thereof.

Such kink characteristics do not have a very serious problem in the normal MOSFET for constituting a digital circuit. However, in the MONOS type FET for constituting a non-volatile memory, kink characteristics may present a concern. In the non-volatile memory, a circuit is configured so that the stored information is determined to be "1" in case of drain current Id=Id1, the stored information is determined to be "0" in case of drain current Id=Id0. The stored information of being "1" is determined by the threshold voltage in case of drain current Id=Id1, and is determined by the threshold voltage for controlling the inside current channel in both the normal electrical characteristics shown in FIG. 26 and the electrical characteristics having kink characteristics shown in FIG. 25. The stored information of being "0" is determined by the threshold voltage in case of drain current Id=Id0, and is determined by the threshold voltage for controlling the inside current channel in the normal electrical characteristics shown in FIG. 26, whereas is determined by the threshold voltage for controlling the current channel on both sides of which the threshold voltage is lowered, in the electrical characteristics having kink characteristics shown in FIG. 25. For this reason, a write margin in case of having kink characteristics shown in FIG. 25 becomes remarkably smaller (narrower) than a write margin in case of being normal as shown in FIG. 26.

In this manner, in the MONOS type FET for constituting a non-volatile memory, the kink characteristics have a remarkably larger influence on circuit characteristics than the normal MOSFET for constituting a digital circuit. Such a problem is not limited to a MONOS type, and can commonly occur in all the FETs used in a circuit sensitive to a fluctuation in threshold voltage. For example, the above type is an FET used in an analog circuit requiring linearity.

In order to solve such a problem, a manufacturing method for a semiconductor device 1 according to a fourth embodiment is a manufacturing method for a semiconductor device in which an FET is formed, and is configured as follows.

An insulating layer that isolates the FET from other elements is formed (step (f)). An example thereof is shown in FIG. 22. FIG. 22 is a schematic cross-sectional view (cross-section X-X of FIG. 21) illustrating the semiconductor device 1 in order to explain a channel ion implantation step of the MONOS type FET 54. FIG. 22 shows only a region having the MONOS type FET 54 formed therein. The N-type well 11 and the STI 30 are formed on the surface of the substrate 10, and the P-type channel region 16 is formed by implanting boron ions ($B^+$) or boron fluoride ions ($BF_2^+$) from a direction perpendicular to the surface of the substrate 10 (step (l0)).

Subsequently to the step (f), impurity ions are implanted from a direction which is substantially perpendicular to the direction of the channel length (L) of the FET and is inclined at a predetermined first angle (θ) from a direction normal to the surface of the semiconductor substrate (step (l1)). An example thereof is shown in FIG. 23. FIG. 23 is a schematic cross-sectional view (cross-section X-X of FIG. 21) illustrating the semiconductor device 1 in order to explain an oblique ion implantation step from one side to the channel region of the MONOS type FET 54. The N-type well 11, the P-type well 15, the P-type channel region 16, and the STI 30 are formed on the substrate 10, and arsenic ions ($As^+$) or phosphorus ions ($P^+$) are implanted from a direction which is substantially perpendicular to the direction of the channel length (L) of the MONOS type FET 54 and is inclined at a predetermined first angle (θ1) from the normal direction of the surface of the substrate 10. Here, the wording "substantially perpendicular to the direction of the channel length (L) of the FET" does not mean accurately 90°, and may not preferably be a direction which is perpendicular to the direction of the channel width (W). The same is true of other places described. Impurity ions are implanted into a region 17_1 excluding a region having a width ds1 from the sidewall of the STI 30 on the left side of the drawing, in the P-type channel region 16.

Next, impurity ions are implanted from a direction which is substantially perpendicular to the direction of the channel length and is inclined at a predetermined second angle reverse to the first angle from the normal direction of the surface of the semiconductor substrate (step (l2)). An example thereof is shown in FIG. 24. FIG. 24 is a schematic cross-sectional view (cross-section X-X of FIG. 21) illustrating the semiconductor device 1 in order to explain an oblique ion implantation step from the other side to the channel region of the MONOS type FET 54. The N-type well 11, the P-type well 15, the P-type channel region 16, and the STI 30 are formed on the substrate 10, and arsenic ions ($As^+$) or phosphorus ions ($P^+$) are implanted from a direction which is substantially perpendicular to the direction of the channel length of the MONOS type FET 54 and is inclined at a second angle (θ2) reverse to the first angle (θ1) from the normal direction of the surface of the substrate 10. Impurity ions are implanted into a region 17_2 excluding a region having a width ds2 from the sidewall of the STI 30 on the left side of the drawing, in the P-type channel region 16.

In the examples described with reference to FIGS. 22 to 24, the steps (l1) and (l2) are counter ion implantation steps of implanting reverse conductive donor impurity ions into the P-type channel region 16 formed by the step (l0). Thereby, it is possible to further increase controllability in case that a fluctuation in threshold voltage is suppressed. In case that the step (l0) is a so-called normal channel ion implantation step and a step of implanting, for example, acceptor impurity (of which the semiconductor conductivity type is set to a P type in case of being activated within a semiconductor) ions from the ordinary normal direction of the surface of the semiconductor substrate, the steps (l1) and (l2) are steps of implanting reverse donor impurity (of which the semiconductor conductivity type is set to a reverse N type in case of being activated within a semiconductor) ions. The concentration of the impurities implanted in the step (l0) can be reduced by the ion implantation of the steps (l1) and (l2). In this case, the ion implantation of the steps (l1) and (l2) is called counter ion implantation to the ion implantation of the step (l0). Conversely, the dose of the step (l0) may be made lower, and be caused to function as the counter ion implantation of the ion implantation of the steps (l1) and (l2). Since a dose is adjusted generally at a desired impurity concentration in so-called normal ion implantation, and impurity concentration is adjusted by both-oblique-direction ion implantation of the steps (l1) and (l2), it is possible to increase the degree of freedom of adjustment, and to further increase controllability in case that a fluctuation in threshold voltage is suppressed.

The basic technical idea of the fourth embodiment is not limited to the MONOS type FET 54, and is also not limited to the counter ion implantation.

An insulating layer which is typified by the STI 30 is formed higher by height hs than the semiconductor surface of the semiconductor substrate 10, spaced apart by a channel width W, on both sides in the direction (X-X direction) of the channel width W of the channel region of the FET. The region having a width ds1 from one sidewall of the STI 30 in the channel width W is shaded by the STI 30 through the oblique ion implantation from the angle θ1 of the step (11) and thus impurity ions are not implanted into the region, whereas impurity ions are implanted into the region 17_1. The region having a width ds2 from the other sidewall of the STI 30 in the channel width W is shaded by the STI 30 through the oblique ion implantation from the reverse angle θ2 in the next step (l2) and thus impurity ions are not implanted into the region, whereas impurity ions are implanted into the region 17_2. Thereby, the region having the width ds1 from one side of the vicinity of the sidewall of the STI 30 and a region (region in which the region 17_1 and region 17_2 overlap each other) located at the center of the channel other than the region having the width ds2 from the other side have impurity concentration according to the sum of doses from both sides of the ion implantation of the steps (l1) and (l2), whereas a region in the vicinity of the sidewall has impurity concentration specified by only the dose of each ion implantation. In this manner, the dose of the ion implantation in the vicinity of the sidewall of the STI 30 and the dose to the central portion can be made different from each other in a self-aligned manner. Thereby, since it is possible to adjust the amount of impurities implanted into each of the inside current channel away from the sidewall of the STI 30 and the current channel on both sides formed along the vicinity of the sidewall, and to suppress the occurrence of the kink characteristics, the write margin of the non-volatile memory is improved.

The ion implantation of the steps (l1) and (l2) can be used for determining the impurity concentration of the channel, and can also be used as the counter ion implantation to the ion implantation of the step (l0) as stated above.

It is preferable that the angle θ1 and the angle θ2 be set to 45° (θ1≈−θ2≈45°) generally. Thereby, it is possible to stably control the size of the shaded region without reducing a range undesirably. Impurities can be distributed so as to have the peak of an impurity profile at a depth closer to the range determined by acceleration energy as it is shallower (closer to a direction perpendicular to the semiconductor substrate), whereas the sizes of the shaded regions ds1 and ds2 decrease, and factors fluctuating depending on the shape of the end of the STI insulating layer 30 increase. On the other hand, as the angles θ1 and θ2 of the both-oblique-direction ion implantation are larger (closer to a direction parallel to the surface of the semiconductor substrate), the peak of the impurity profile becomes shallower than the range determined by the acceleration energy. Therefore, in order to implanting impurities at a desired depth, it is necessary to increase the acceleration energy. For this reason, the angle θ1 and the angle θ2 are not necessarily be accurately 45°, but are generally set to 45° most preferably.

Thereby, it is possible to provide a manufacturing method for a semiconductor device having good controllability which is capable of suppressing a fluctuation in threshold voltage within the channel region of the FET formed using the STI in element isolation with a high degree of accuracy.

The manufacturing method for a semiconductor device according to the fourth embodiment can be applied to the above-mentioned first embodiment.

As described with reference to FIGS. 4 and 5, the STI 30 located higher than the semiconductor surface of the substrate 10. The height of the STI 30 in this case is specified by the thickness of the CMP stopper film 29 and the margin of CMP. The margin of CMP as used herein indicates the amount of polishing which is continued to allow for a margin for preventing polishing residue from occurring after the emergence of the CMP stopper film 29 in a polished surface is detected. Thereby, it is possible to form an STI stepped difference with good controllability.

Thereafter, as described with reference to FIG. 9, the well ion implantation is performed on an opening formed in the non-volatile memory region 44. Thereafter, as described with reference to FIG. 10, the resist 92 is removed from the surface of the semiconductor device 1 shown in FIG. 8, and then impurities are introduced by ion implantation, and thus the channel region 16 for the MONOS type FET 54 is formed in the vicinity of the surface within the substrate 10 of the MONOS type FET forming region 44. The impurity concentration of the channel region is adjusted by this ion implantation (channel ion implantation), and the threshold voltage of the MONOS type FET 54 is adjusted. In this ion implantation, it is possible to perform the ion implantation of the above-mentioned steps (l1) and (l2) or the ion implantation inclusive of the step (l0).

As described above, with respect to the semiconductor device 1 including the MONOS type FET 54 having a charge storage film within a gate insulating film and three types of MOSFETs 51 to 53 of a high-voltage, a middle-voltage, and a low-voltage, the ion implantation step according to the third embodiment is applied to the MONOS type FET 54 having a particularly conspicuous influence of the kink characteristics. Thereby, since it is possible to adjust the amount of impurities implanted into each of the inside current channel away from the sidewall of the STI 30 and the current channel on both sides formed along the vicinity of the sidewall, and to suppress the occurrence of the kink characteristics, the write margin of the non-volatile memory is improved. Since the size of a region in which a dose is lowered can be specified by the height hs of the sidewall of the STI 30 and the angles θ1 and θ2 of ion implantation, it is possible to provide a manufacturing method having good controllability.

In the first embodiment, an example is illustrated in which the ion implantation step according to the fourth embodiment is applied to only the MONOS type FET 54 as described above, but the step may be applied to the other MOSFETs 51 to 53 similarly. For example, it is effective in case that an analog circuit requiring high linearity is constituted by the other MOSFETs 51 to 53.

In order to apply the fourth embodiment to the first embodiment, as described above, before the channel ion implantation, the sidewall or the like of the STI 30 having a height for creating a shadow at the side of the ion implantation region may preferably be formed. The context between the steps of forming the STI 30, the wells 12 to 15, and the gate insulating films 24 to 26 can be changed arbitrarily. In addition, the manufacturing method described in the first embodiment with respect to other respective steps is illustrative, and the fourth embodiment is not limited thereto.

Fifth Embodiment

Prevention of Etching Damage to Gate Electrode of MONOS Type FET

In the manufacturing method for a semiconductor device according to the first embodiment, the gate electrode 64 of the MONOS type FET 54 is formed and patterned, and then the gate electrodes 61 to 63 of the MOSFETs 51 to 53 are patterned. For this reason, as shown in FIG. 18, a lithography process is performed in which the entire surface of the substrate 10 is covered with a resist film, and the region 44 of the MONOS type FET and the regions having the gate electrodes 61 to 63 of the MOSFETs 51 to 53 are formed are left behind and opened. In this case, the resist film 94 is applied with a substantially uniform film thickness. However, since the gate electrode 64 is previously patterned in the region 44 of the MONOS type FET 54, the thickness of the resist film 94 on the gate electrode 64 becomes smaller than other regions in order to bury the irregularities thereof. For this reason, in the etching step of removing a polysilicon film in which the gate electrodes 61 to 63 of the MOSFETs 51 to 53 are formed, except for a gate electrode portion, since the resist film 94 is also etched simultaneously, there is a concern that the resist film 94 formed thinner than other regions on the gate electrode 64 of the MONOS type FET 54 from the beginning may disappear, and the gate electrode 64 of the MONOS type FET 54 may be exposed, and etching damage may be suffered.

In order to solve such a problem, a manufacturing method for a semiconductor device 1 according to a fifth embodiment is a manufacturing method for the semiconductor device 1 including the non-volatile memory FET 54 and the MOSFETs 51 to 53, and is configured as follows.

A first gate electrode film 31 is formed on the entire surface of the semiconductor substrate (step (e)). For example, as described with reference to FIG. 3, the first gate electrode film 31 is formed by depositing a polysilicon film using a CVD method.

Thereafter, the region having the non-volatile memory FET 54 formed therein is opened, and the semiconductor surface of the substrate 10 is exposed (step (i)). For example, as described with reference to FIG. 8, a resist is applied onto the surface of the semiconductor device 1 shown in FIG. 7, that is, on the anti-oxidation film 34, and the non-volatile memory MONOS type FET forming region 44 is opened by lithography. The anti-oxidation film 34, the polysilicon film 32, the first gate electrode film 31, and the gate insulating film 24 are removed by etching, using the resist 92 having an opening in the MONOS type FET forming region 44 as a mask. Here, the first embodiment is an example in which the polysilicon film 32 and the anti-oxidation film 34 are formed on the gate electrode film 31, but in the fifth embodiment, the formation of the first gate electrode film serving as the gate electrodes 61 to 63 of the MOSFETs 51 to 53 is required, and the structure of the film is arbitrary.

Further, thereafter, a charge storage three-layer film 20 is formed by sequentially depositing a first potential barrier film 21, a charge storage film 22, and a second potential barrier film 23 (step (m)). For example, as described with reference to FIG. 11, the potential barrier film 21, the charge storage film 22, and the potential barrier film 23 are sequentially formed on the surface of the semiconductor device 1 shown in FIG. 10. The potential barrier film 21 and the potential barrier film 23 are, for example, silicon oxide films, and the charge storage film 22 is, for example, a silicon nitride film or a silicon oxynitride film. These films are formed by a CVD method.

Further, thereafter, a third gate electrode film is formed on the charge storage three-layer film (step (n)). For example, as described with reference to FIG. 12, a polysilicon film is deposited on the surface of the semiconductor device 1 shown in FIG. 11, for example, by a CVD method, and is doped with impurities such as phosphorus (P) at a high concentration to achieve a reduction in resistance, thereby allowing the third gate electrode film 33 to be formed. The third gate electrode film 33 serves as a gate electrode 64 of the MONOS type FET 54. In this case, it is preferable that the third gate electrode film 33 be deposited with a thickness smaller than the sum of the thickness of the first gate electrode film 31 and the thickness of the polysilicon film 32. In a subsequent step described with reference to FIG. 18, this is because the thickness of a resist film on the gate electrode 64 of the MONOS type FET 54 is prevented from becoming excessively small.

Further, thereafter, a gate electrode of the non-volatile memory FET is patterned (step (o)). For example, as described with reference to FIGS. 14 and 15, a resist film 93 is formed, using lithography, in a portion in which the gate electrode 64 for the MONOS type FET 54 is formed, and a portion in which a wiring located on the same layer as the gate electrode 64 is formed, and the silicon oxide film 35 and the third gate electrode film 33 are removed by etching, using the formed resist film 93 as a mask. After etching, the resist film 93 is also cleaned off and removed. In this case, the gate electrode 64 is constituted by two layers of the silicon oxide film 35 and the third gate electrode film 33.

Further, thereafter, a resist film is formed, using lithography, in a region of the non-volatile memory FET and a region having the first gate electrode of the first breakdown voltage MOSFET formed therein (step (p)). For example, as described with reference to FIG. 18, a resist film 94 is formed, using lithography, in portions in which the gate electrodes 61 to 63 for the MOSFETs 51 to 53 are formed, and a portion in which a wiring located on the same layer as the gate electrodes 61 to 63 is formed.

Further, thereafter, the first gate electrode film which is not covered with the resist film formed in the step (p) is etched (step (q)). For example, as described with reference to FIG. 19, the first gate electrode layer 31 and the polysilicon film 32 are removed by etching, using the formed resist 94 as a mask. After etching, the resist 94 is also cleaned off and removed.

Here, the value of the product of S/L and H/L is specified in case that the line of the gate electrode of the non-volatile memory FET is set to L, the space thereof is set to S, and the height thereof is set to H so that in the step (p), the thickness of the resist film on the gate electrode of the non-volatile memory FET is set to a thickness which is not lost by the etching step of the step (q).

Thereby, it is possible to suppress etching damage to the gate electrode of the MONOS type FET in the etching step of patterning the gate electrode of a MOSFET.

The more detailed description will be given of a method of specifying the product of S/L and H/L so that the thickness of the resist film 94 on the gate electrode of the non-volatile memory FET mentioned above is set to a thickness which is not lost by the etching step of the step (q).

Figure 27:
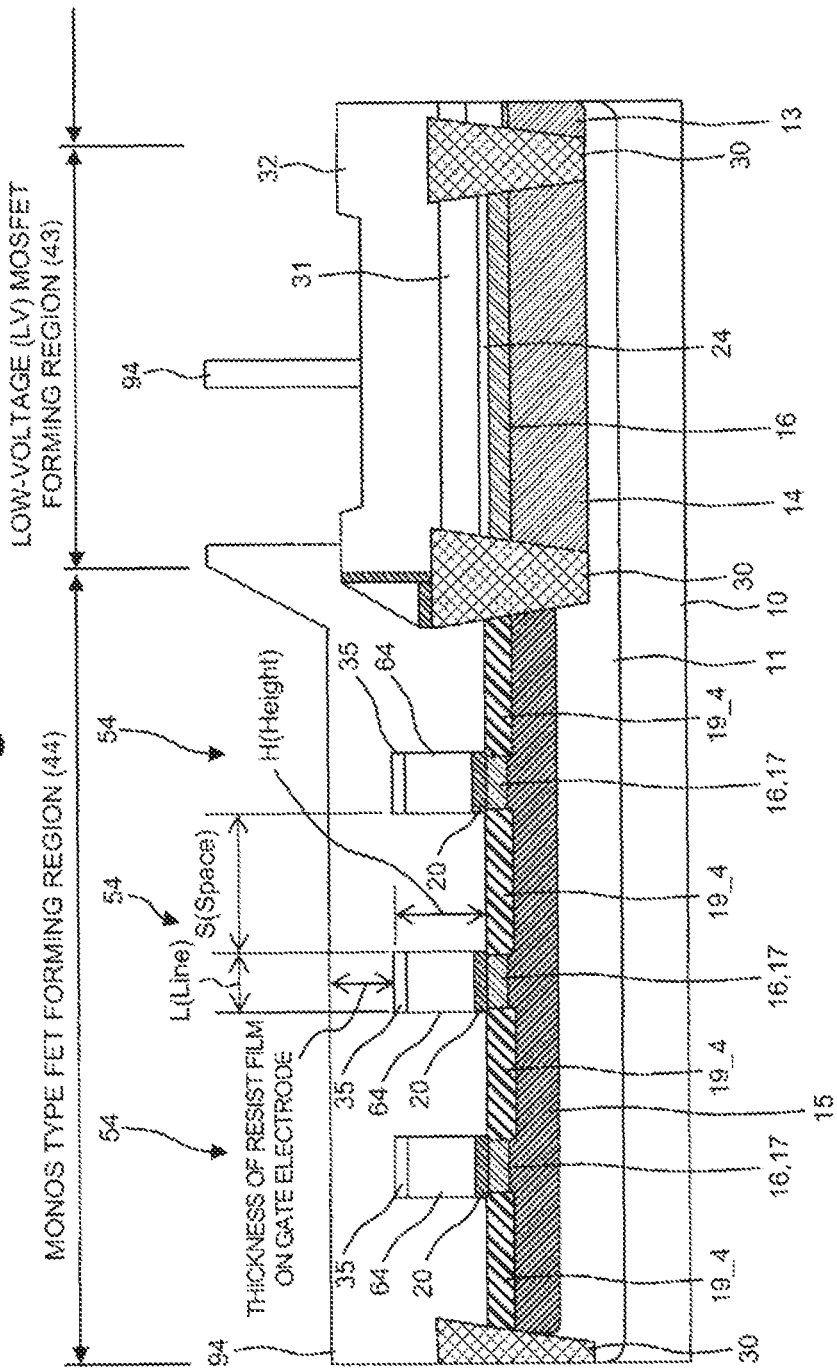
FIG. 27 is a schematic cross-sectional view illustrating the semiconductor device 1 showing a structure of a plurality of gate electrodes of the MONOS type FET 54 in the course of a manufacturing method (after a lithography process for patterning the gate electrodes 61 to 63 for a MOSFET).

FIG. 27 is a schematic cross-sectional view illustrating the semiconductor device 1 showing a structure of a plurality of gate electrodes of the MONOS type FET 54 in the course of a manufacturing method (after a lithography process for patterning the gate electrodes 61 to 63 for a MOSFET). The drawing is configured as a halfway step of the same manufacturing method as that of FIG. 18, and thus the description of the same components as those in FIG. 18 will not be given. The gate electrodes 64 of a plurality of MONOS type FETs 54 are formed within one MONOS type FET forming region 44 with the STIs 30 interposed between both sides. The line of the gate electrode 64 is set to L (Line), the space thereof is set to S (Space), and the height thereof is set to H (Height).

Figure 28:
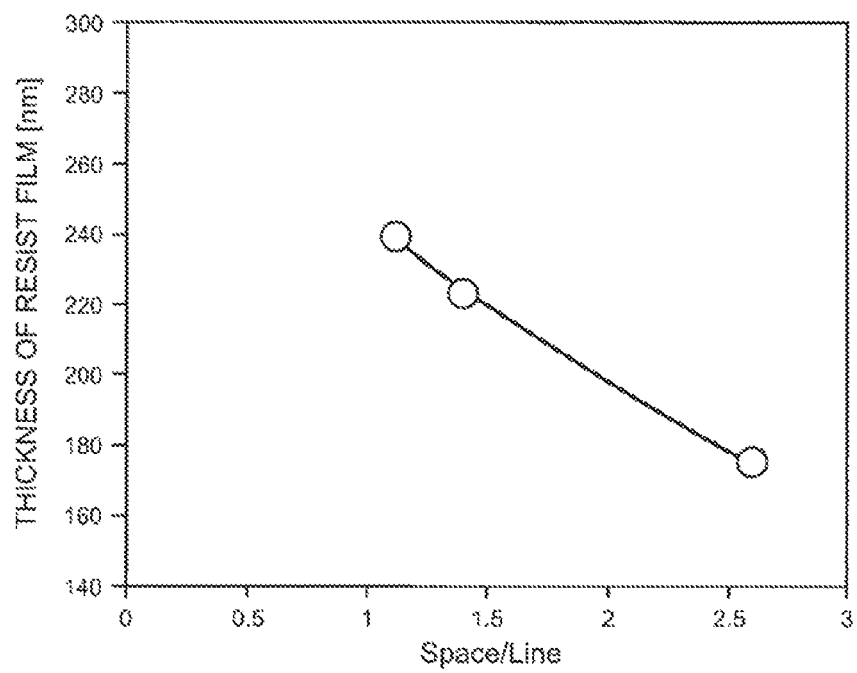
FIG. 28 is a graph illustrating experimental results regarding a relationship between the space/line ratio of the gate electrode of the MONOS type FET 54 and the thickness of a resist film on the gate electrode.

FIG. 28 is a graph illustrating experimental results regarding a relationship between the space/line ratio of the gate electrode of the MONOS type FET 54 and the thickness of a resist film on the gate electrode. The horizontal axis represents a Space/Line ratio, and the vertical axis represents a thickness of the resist film 94 on the gate electrode 64 in this case. The thickness of the resist film in case of Space/Line=1 is 240 nm, and decreases as the Space/Line ratio increases.

Figure 29:
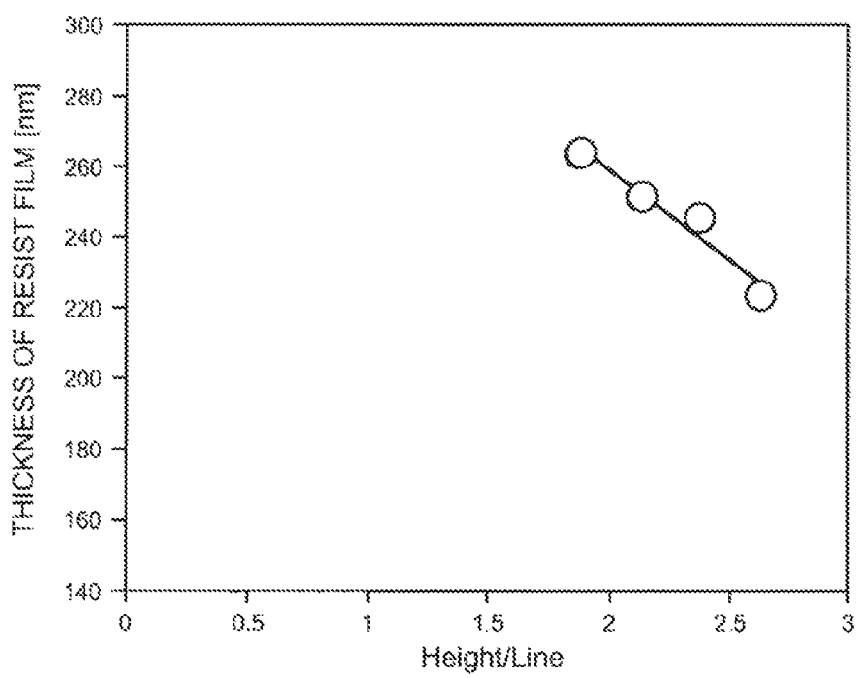
FIG. 29 is a graph illustrating experimental results regarding a relationship between the height/line ratio of the gate electrode of the MONOS type FET 54 and the thickness of the resist film on the gate electrode.

FIG. 29 is a graph illustrating experimental results regarding a relationship between the height/line ratio of the gate electrode of the MONOS type FET 54 and the thickness of the resist film on the gate electrode. The horizontal axis represents a Height/Line ratio, and the vertical axis represents a thickness of the resist film 94 on the gate electrode 64 in this case. The thickness of the resist film in case of Height/Line=0.5 is 265 nm, and decreases as the Height/Line ratio increases.

FIG. 30 is a graph illustrating experimental results regarding a relationship between the value of space/line×height/line (S/L×H/L) of the gate electrode of the MONOS type FET 54 and the thickness of the resist film on the gate electrode. The horizontal axis represents a value of space/line×height/line (S/L×H/L) which is the product of the Space/Line ratio and the Height/Line ratio, and the vertical axis represents a thickness of the resist film 94 on the gate electrode 64 in this case. The thickness of the resist film in case of S/L×H/L=1 is 240 nm, and decreases as the value of S/L×H/L increases. The appropriate value of S/L×H/L is specified so that the thickness of the resist film 94 on the gate electrode 64 is set at least to a thickness which is not lost by the etching step of the step (q). For example, in case that the thickness of the resist film 94 is 200 nm, the value of S/L×H/L is suppressed to a value smaller than 2.

Here, the line L and the space S are optimized generally so as to minimize the area of a memory cell of a non-volatile memory constituted by the MONOS type FET 54, and thus may be set so that the height H of the gate electrode 64 is made smaller, that is, the thickness of the third gate electrode film 33 becomes smaller than the thicknesses of the first gate electrode film 31 and the polysilicon film 32 of a MOSFET.

Thereby, it is possible to suppress etching damage to the gate electrode of the MONOS type FET in the etching step of patterning the gate electrode of a MOSFET.

The fifth embodiment can be widely applied to a manufacturing method for a semiconductor device in which the gate electrode 64 of the MONOS type FET 54 is formed and patterned, and then the gate electrodes 61 to 63 of the MOSFETs 51 to 53 are patterned, and each relevant step for applying the fifth embodiment to the first embodiment has been described. The manufacturing method described in the first embodiment with respect to other respective steps is illustrative, and the fifth embodiment is not limited thereto.

As stated above, while the present invention devised by the inventor has been described specifically based on the first and fifth embodiments, the present invention is not limited thereto, and it is contemplated that various changes and modifications may be made without departing from the scope of the invention.

For example, examples in which all the second to fifth embodiments are applied to the first embodiment have been illustrated, but the application of some embodiments of these examples may be omitted.

What is claimed is:

1. A manufacturing method for a semiconductor device including a non-volatile memory FET and a MOSFET, comprising:
   (e) forming a first gate electrode film on the entire surface of a semiconductor substrate;
   (i) opening a region having the non-volatile memory FET formed therein and exposing a semiconductor surface of the semiconductor substrate, after the step (e);
   (m) forming a charge storage three-layer film by sequentially depositing a first potential barrier film, a charge storage film, and a second potential barrier film, after the step (i);
   (n) forming a second gate electrode film on the charge storage three-layer film, after the step (m);
   (o) patterning a gate electrode of the non-volatile memory FET after the step (n);
   (p) forming a resist film in a region of the non-volatile memory FET and a region having a gate electrode of the MOSFET formed therein, using lithography, after the step (o); and
   (q) etching the first gate electrode film which is not covered with the resist film formed in the step (p), after the step (p),
   wherein a value of a product of S/L and H/L is specified in a case that a line of the gate electrode of the non-volatile memory FET is set to L, a space thereof is set to S, and a height thereof is set to H so that in the step (p), a thickness of the resist film on the gate electrode of the non-volatile memory FET is set to a thickness which is not lost by the etching step of the step (q).

2. The manufacturing method for a semiconductor device according to claim 1, wherein the first gate electrode film is a first polysilicon film, the method further comprising the following steps:
   (f1) forming a CMP stopper film on the first gate electrode film after the step (e);
   (f2) forming an element isolation groove in each element isolation region that isolates a plurality of the non-volatile memory FETs and a plurality of the MOSFETs from each other, after the step (f1);
   (f3) burying the element isolation groove after the step (f2), and further forming an insulating film on the entire surface of the semiconductor substrate;
   (f4) polishing the surface of the semiconductor substrate until the CMP stopper film is exposed, through chemical mechanical polishing (CMP), after the step (f3);
   (f5) selectively removing the CMP stopper film after the step (f4); and
   (g) a step of forming a second polysilicon film on the entire surface of the semiconductor substrate, after the step (f5), and
   the step (q) further comprises etching the first polysilicon which is the first gate electrode film and the second polysilicon which are not covered with the resist film formed in the step (p).

3. The manufacturing method for a semiconductor device according to claim 2, wherein a thickness of the second gate electrode film is smaller than that of a gate electrode film of the MOSFET in which the first polysilicon film and the second polysilicon film are laminated.

4. The manufacturing method for a semiconductor device according to claim 1, wherein the first potential barrier film and the second potential barrier film are silicon oxide films, and the charge storage film is a silicon nitride film or a silicon oxynitride film.

5. A manufacturing method for a semiconductor device having a non-volatile memory FET and a MOSFET formed on a single semiconductor substrate, comprising:
   forming a gate electrode film of the MOSFET in a portion of a surface of the semiconductor substrate;
   patterning and forming a gate electrode of the non-volatile memory FET in another portion of the surface of the semiconductor substrate;
   forming a resist film for patterning the gate electrode of the MOSFET; and
   etching the gate electrode film corresponding to a portion which is not covered with the resist film,
   wherein a value of a product of S/L and H/L is specified in a case that a line of the gate electrode of the non-volatile memory FET is set to L, a space thereof is set to S, and a height thereof is set to H so that thickness of the resist film on the gate electrode of the non-volatile memory FET is set to a thickness which is not lost by the etching.

6. The manufacturing method for a semiconductor device according to claim 5, wherein the gate electrode film of the MOSFET is formed by a first polysilicon film formed before formation of an element isolation layer and a second polysilicon film formed after formation of the element isolation layer being laminated.

7. The manufacturing method for a semiconductor device according to claim 6, wherein a thickness of a second gate electrode film is smaller than that of the gate electrode film of the MOSFET in which the first polysilicon film and the second polysilicon film are laminated.

8. The manufacturing method for a semiconductor device according to claim 5, wherein the first potential barrier film and the second potential barrier film are silicon oxide films, and the charge storage film is a silicon nitride film or a silicon oxynitride film.

\* \* \* \* \*